United States Patent
Kaneko et al.

(10) Patent No.: US 9,443,712 B2
(45) Date of Patent: Sep. 13, 2016

(54) SUBSTRATE CLEANING METHOD AND SUBSTRATE CLEANING SYSTEM

(71) Applicant: TOKYO ELECTRON LIMITED, Minato-ku (JP)

(72) Inventors: Miyako Kaneko, Nirasaki (JP); Takehiko Orii, Nirasaki (JP); Itaru Kanno, Minato-ku (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 352 days.

(21) Appl. No.: 14/025,085

(22) Filed: Sep. 12, 2013

(65) Prior Publication Data
US 2014/0144464 A1   May 29, 2014

(30) Foreign Application Priority Data
Nov. 26, 2012 (JP) .................... 2012-257081

(51) Int. Cl.
| | | |
|---|---|---|
| H01L 21/02 | (2006.01) | |
| B08B 3/04 | (2006.01) | |
| H01L 21/67 | (2006.01) | |
| H01L 21/687 | (2006.01) | |

(52) U.S. Cl.
CPC ..... *H01L 21/02052* (2013.01); *H01L 21/0206* (2013.01); *H01L 21/0209* (2013.01); *H01L 21/02057* (2013.01); *H01L 21/6715* (2013.01); *H01L 21/67046* (2013.01); *H01L 21/67051* (2013.01); *H01L 21/67115* (2013.01); *H01L 21/68728* (2013.01); *B08B 3/04* (2013.01)

(58) Field of Classification Search
CPC . B08B 7/0014; C09D 5/008; H01L 21/0209; H01L 21/02052; H01L 21/02057; H01L 21/0206
See application file for complete search history.

(56) References Cited

U.S. PATENT DOCUMENTS

| | | | |
|---|---|---|---|
| 5,879,572 A * | 3/1999 | Folsom | ............... B81C 1/00246 216/2 |
| 6,245,677 B1 * | 6/2001 | Haq | ..................... B24B 37/042 257/E21.219 |
| 8,023,099 B2 | 9/2011 | Yamamoto | |
| 2002/0029788 A1 * | 3/2002 | Verhaverbeke | .......... B08B 3/02 134/1.3 |

(Continued)

FOREIGN PATENT DOCUMENTS

| | | |
|---|---|---|
| JP | 04-253332 A | 9/1992 |
| JP | 11-162816 A | 6/1999 |
| JP | 2000-156362 | 6/2000 |

(Continued)

*Primary Examiner* — Michael Kornakov
*Assistant Examiner* — Natasha Campbell
(74) *Attorney, Agent, or Firm* — Oblon, McClelland, Maier & Neustadt, L.L.P.

(57) ABSTRACT

A method for cleaning a substrate includes supplying a treatment solution which includes a volatile component onto the front surface of a substrate, solidifying or curing the treatment solution through vaporization of the volatile component of the treatment solution such that a treatment film is formed on the entire portion of the front surface of the substrate, treating a different surface of the substrate while the entire portion of the front surface of the substrate is covered with the treatment film, and supplying to the substrate a removal solution which removes the treatment film in the amount sufficient such that the treatment film covering the entire portion of the front surface of the substrate is removed substantially in entirety after the treating of the different surface of the substrate is finished.

13 Claims, 16 Drawing Sheets

(56) References Cited

U.S. PATENT DOCUMENTS

2005/0062409 A1\* 3/2005 Yamazaki ........... H01L 27/3246
 313/504
2005/0267253 A1\* 12/2005 Hayashi ................ C08G 77/06
 524/588

FOREIGN PATENT DOCUMENTS

| JP | 2005-322782 A | 11/2005 |
|---|---|---|
| JP | 2008-060368 | 3/2008 |
| JP | 2008-177471 A | 7/2008 |
| JP | 2012-019025 A | 1/2012 |

\* cited by examiner

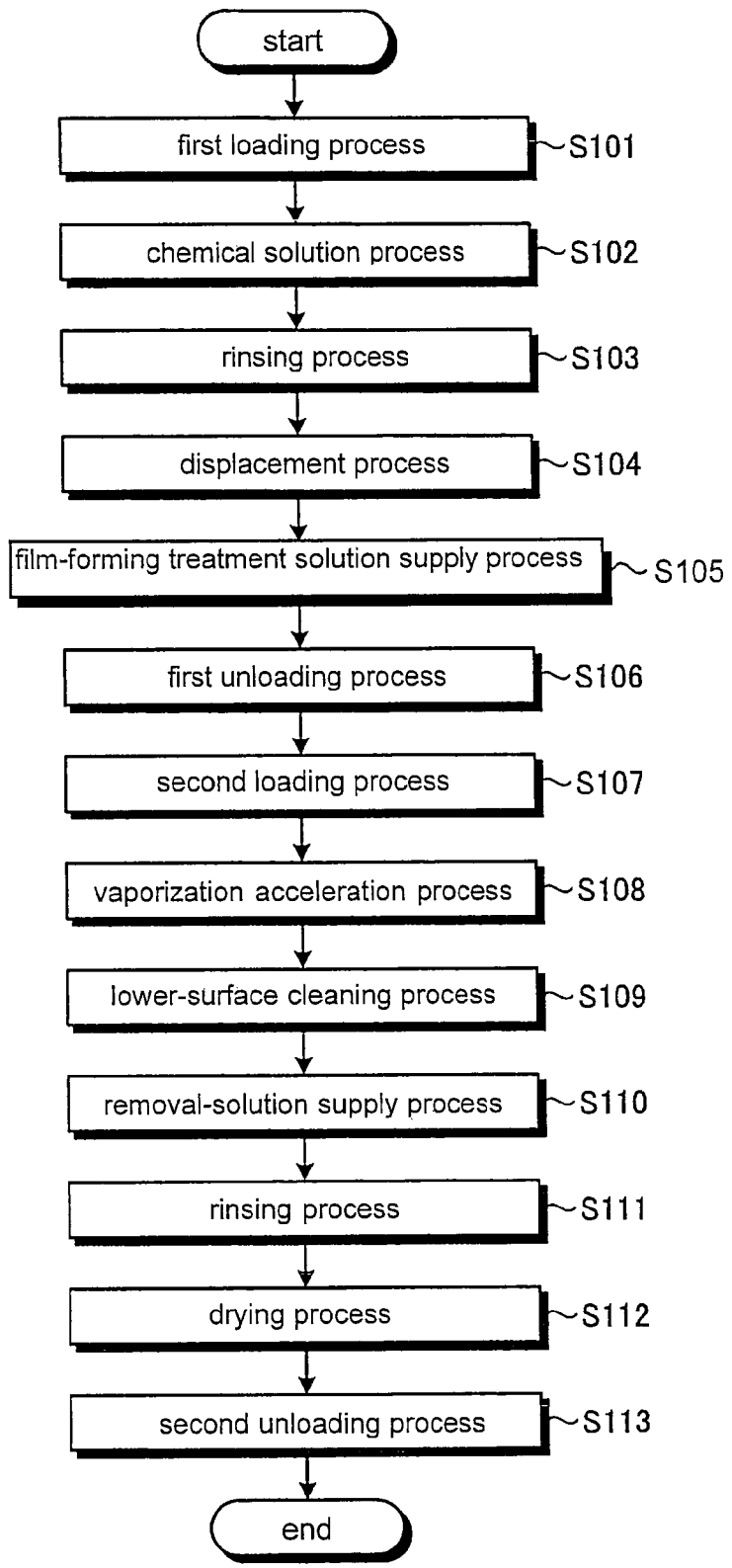

SUBSTRATE CLEANING METHOD AND SUBSTRATE CLEANING SYSTEM

CROSS-REFERENCE TO RELATED APPLICATIONS

The present application is based upon and claims the benefit of priority to Japanese Patent Application No. 2012-257081, filed Nov. 26, 2012, the entire contents of which are incorporated herein by reference.

BACKGROUND OF THE INVENTION

1. Field of the Invention

The present invention relates to a substrate cleaning method and a substrate cleaning system.

2. Description of Background Art

Regarding a substrate cleaning apparatus to remove particles attached to substrates such as silicon wafers and compound semiconductor wafers, there is a type which removes particles by physical force generated when a flowing substance such as liquid or gas is supplied onto the main surface of a substrate. Also, there is another type in which a chemical solution such as SC1 is supplied onto the main surface of a substrate so that particles are removed through chemical reactions (such as etching) of the supplied chemical solution. Japanese Patent Publication No. 2000-156362 describes a cleaning process or the like to be conducted on the main and lower surfaces of a substrate. The entire contents of this publication are incorporated herein by reference.

SUMMARY OF THE INVENTION

According to one aspect of the present invention, a method for cleaning a substrate includes supplying a treatment solution which includes a volatile component onto the front surface of a substrate, solidifying or curing the treatment solution through vaporization of the volatile component of the treatment solution such that a treatment film is formed on the entire portion of the front surface of the substrate, treating a different surface of the substrate while the entire portion of the front surface of the substrate is covered with the treatment film, and supplying to the substrate a removal solution which removes the treatment film in the amount sufficient such that the treatment film covering the entire portion of the front surface of the substrate is removed substantially in entirety after the treating of the different surface of the substrate is finished.

According to another aspect of the present invention, a substrate cleaning system includes a treatment solution supply device for supplying onto the front surface of a substrate a treatment solution which solidifies or is cured to form a treatment film through the vaporization of a volatile component, a surface treatment device for treating a different surface of the substrate while the entire portion of the front surface is covered with the treatment film, and a removal-solution supply device for supplying onto the substrate a removal solution which removes the treatment film formed on the front surface of the substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5 is a flowchart showing the steps of a substrate cleaning process performed by the substrate cleaning apparatus;

DETAILED DESCRIPTION OF THE EMBODIMENTS

Figure 1:
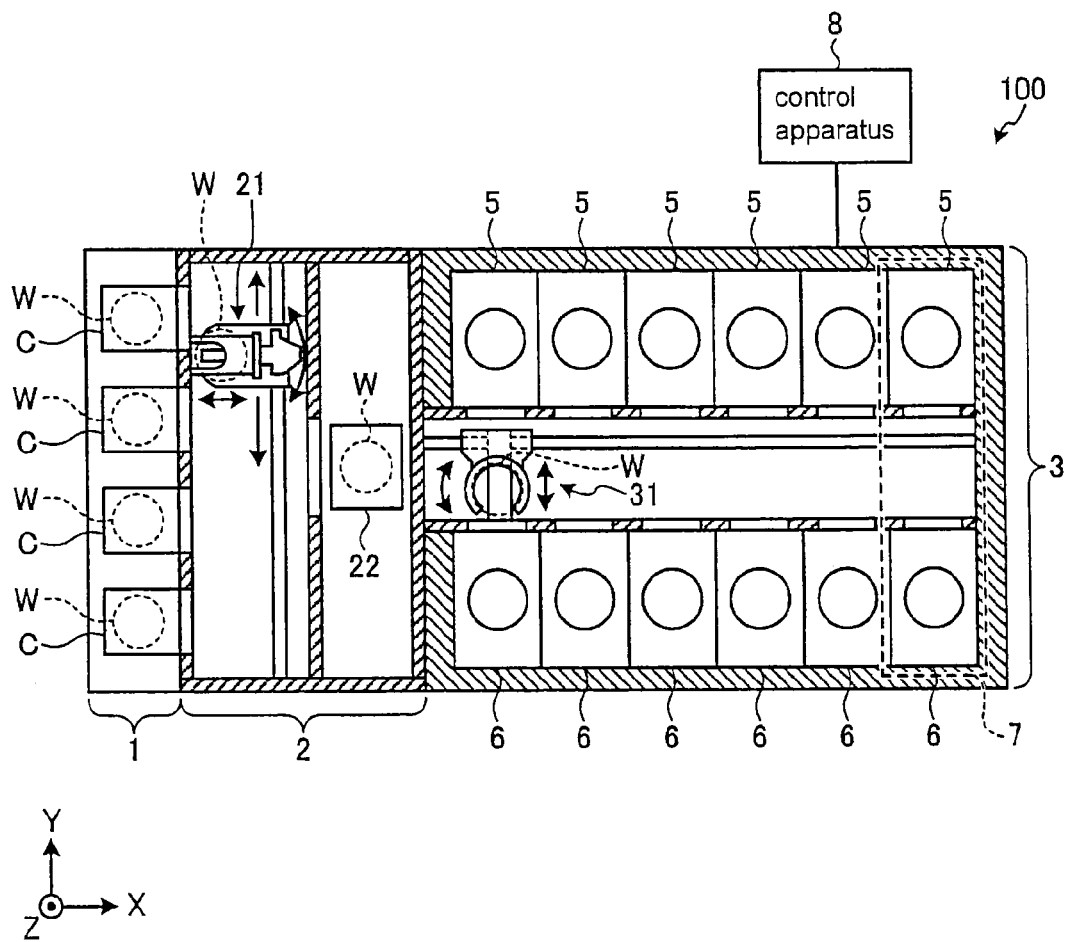
FIG. 1 is a view schematically showing the structure of a substrate cleaning system according to a first embodiment.

The embodiments will now be described with reference to the accompanying drawings, wherein like reference numerals designate corresponding or identical elements throughout the various drawings.

First Embodiment

Structure of Substrate Cleaning System

The schematic structure of a substrate cleaning system according to a first embodiment is described with reference to FIG. 1. FIG. 1 schematically shows the structure of a substrate cleaning system of the first embodiment.

In the following, to clarify positional relationships, axes (X, Y, Z) orthogonal to each other are determined, and a positive Z direction is set to be perpendicular upward to the XY plane. In addition, a negative X direction is set toward the front of a substrate cleaning system, and a positive X direction is set toward the rear of the substrate cleaning system in the following.

As shown in FIG. 1, substrate cleaning system 100 has loading/unloading station 1, transfer station 2 and processing station 3. Loading/unloading station 1, transfer station 2 and processing station 3 are set in position from the front toward the rear of substrate cleaning system 100 in the order of loading/unloading station 1, transfer station 2 and processing station 3.

Loading/unloading station 1 is where carriers (C) are provided to horizontally accommodate multiple (25, for example) wafers (W). For example, four carriers (C) are provided side by side while being positioned immediately adjacent to the front wall of transfer station 2.

Transfer station 2 is positioned in the rear of loading/unloading station 1, and has substrate transfer device 21 and substrate delivery table 22. In transfer station 2, substrate transfer device 21 transfers wafer (W) between carrier (C) in loading/unloading station 1 and substrate delivery table 22.

Processing station 3 is positioned in the rear of transfer station 2. In processing station 3, substrate transfer device 31 is provided in the central section.

Substrate cleaning apparatus 7 is positioned in processing station 3. Substrate cleaning apparatus 7 has first processing apparatus 5 and second processing apparatus 6 which is structured to be different from first processing apparatus 5.

First processing apparatus 5 and second processing apparatus 6 are positioned on their respective sides of substrate transfer device 31. A total of six pairs of first processing apparatus 5 and second processing apparatus 6 are provided in processing station 3 in a direction of front to rear. Positioning first processing apparatuses 5 and second processing apparatuses 6 is not limited to that shown in the drawing.

In processing station 3, substrate transfer device 31 transfers one wafer (W) at a time to and from substrate delivery table 22 of transfer station 2, first processing apparatus 5 and second processing apparatus 6. Substrate cleaning treatment is conducted on one wafer (W) at a time in first processing apparatus 5 and second processing apparatus 6 in substrate cleaning apparatus 7.

Substrate cleaning system 100 has control apparatus 8. Control apparatus 8 controls operations in substrate cleaning system 100. Control apparatus 8 is a computer, for example, and has a control section and a memory section, which are not shown in the drawings. The memory section stores programs to control various processes such as a substrate cleaning process. The control apparatus controls operations in substrate cleaning system 100 by reading and executing the program stored in the memory section.

Such a program may also be stored in a memory medium readable by a computer, and installed from the memory medium into the memory section of control apparatus 8. Memory media readable by a computer are a hard disc (HD), flexible disc (FD), compact disc (CD), magneto-optical disc (MO), memory card and the like.

For simplicity purposes, FIG. 1 shows an example where control apparatus 8 is provided outside substrate cleaning system 100. However, control apparatus 8 may also be provided inside substrate cleaning system 100. For example, it is an option to accommodate control apparatus 8 in a space above first processing apparatus 5 or above second processing apparatus 6.

In substrate cleaning system 100 structured as above, substrate transfer device 21 of transfer station 2 picks up one wafer (W) from carrier (C) positioned in loading/unloading station 1 and places the picked-up wafer (W) onto substrate delivery table 22. Wafer (W) on substrate delivery table 22 is loaded into first processing apparatus 5 by substrate transfer device 31 of processing station 3, and then loaded into second processing apparatus 6. Details of the substrate cleaning treatment conducted in first processing apparatus 5 and second processing apparatus 6 are described later.

Wafer (W) cleaned in first processing apparatus 5 and second processing apparatus 6 is unloaded by substrate transfer device 31 from second processing apparatus 6 and placed again onto substrate delivery table 22. Then, treated wafer (W) on substrate delivery table 22 is returned to carrier (C) by substrate transfer device 21.

In a conventional substrate cleaning apparatus, particles are removed using physical force or using chemical reactions of chemical solutions. However, when conventional techniques are employed, problems may arise; for example, patterns formed on the main surface of a wafer may collapse because of physical force, or the base film of a wafer may be eroded by etching or the like.

Instead of using conventional techniques, substrate cleaning apparatus 7 according to the first embodiment uses change in the volume of a treatment solution for particle removal so that particles attached to wafer (W) are removed, and pattern collapse or base film erosion is suppressed.

Substrate Cleaning Method

Figure 2A:
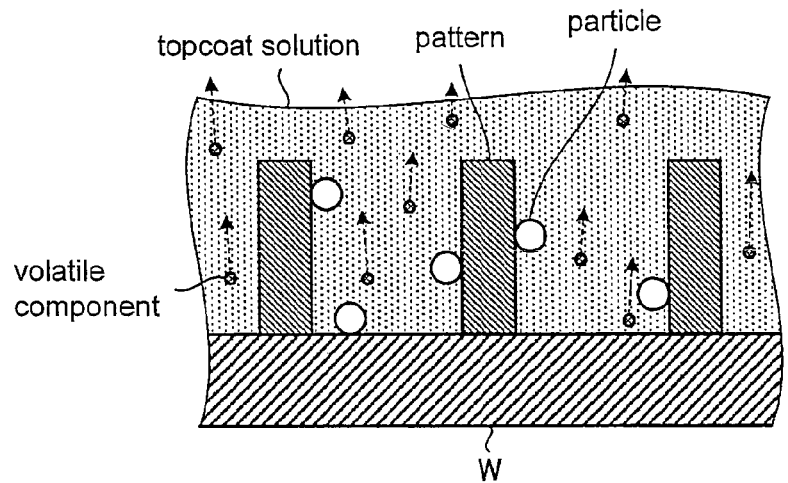
FIG. 2A is a view illustrating a substrate cleaning method.
Figure 2B:
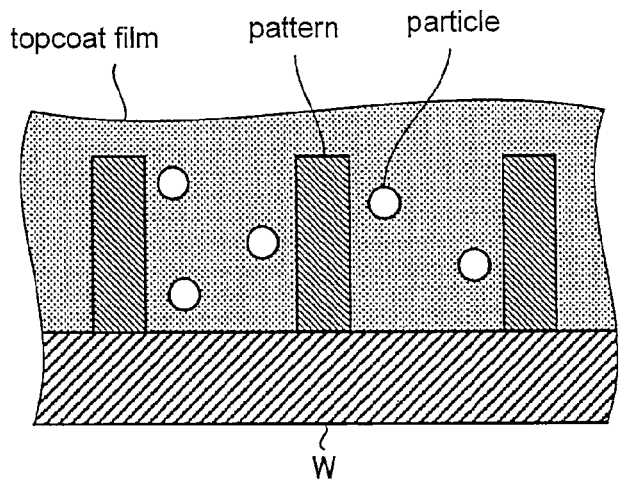
FIG. 2B is a view illustrating a substrate cleaning method.
Figure 2C:
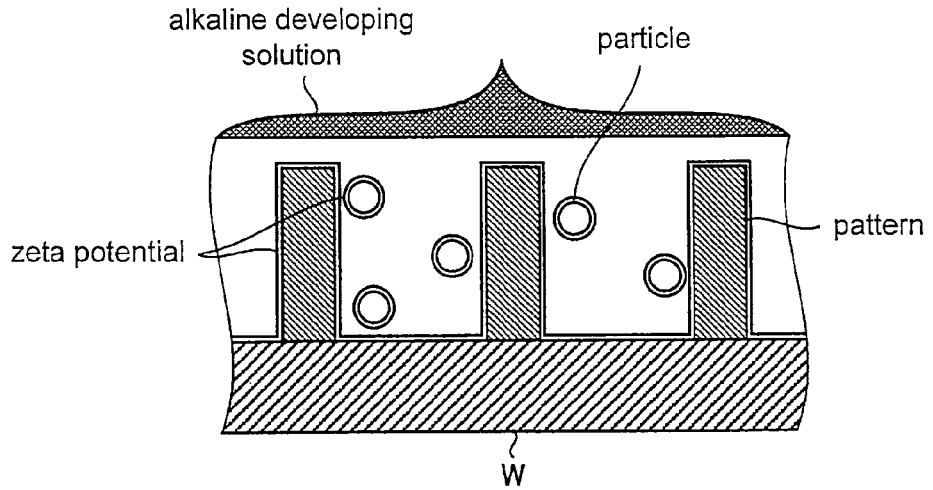
FIG. 2C is a view illustrating a substrate cleaning method.

A substrate cleaning method performed by substrate cleaning apparatus 7 of the first embodiment is described in detail with reference to FIG. 2A~FIG. 2C. FIGS. 2A~2C are views illustrating the substrate cleaning method. In the following, a surface where circuits are formed on wafer (W) is referred to as a "main surface" and the surface opposite the main surface as a "lower surface."

As shown in FIG. 2A, a treatment solution that contains a volatile component and forms a film on the entire main surface of wafer (W) (hereinafter referred to as a "film-forming treatment solution") is used in the first embodiment. In particular, a film-forming treatment solution to form a topcoat film on wafer (W) (hereinafter referred to as a "topcoat solution") is used. Here, a topcoat film is a protective film applied on a surface of a resist film to prevent the infiltration of an immersion solution into the resist film. An immersion solution is used for exposure in immersion lithography, for example.

As shown in FIG. 2A, substrate cleaning apparatus 7 supplies a topcoat solution on wafer (W). The topcoat solution supplied on wafer (W) contracts its volume when the volatile component contained in the solution is vaporized. Moreover, since the topcoat solution contains acrylic resin characterized by volume contraction when it is hardened or cured, the volume of the topcoat solution also contracts because of curing contraction of the acrylic resin. Here, "hardened" means the resin solidifies, and "cured" means molecules are bonded to be polymers (for example, cross linking or polymerization).

The topcoat solution solidifies or cures as its volume contracts, and forms a topcoat film. During that time, because of strain caused by the volume contraction of the topcoat solution (tensile force), particles attached to patterns or the like are removed from the patterns or the like (see FIG. 2B).

Because of volume contraction that occurs in a topcoat solution through vaporization of the volatile component and curing contraction of acrylic resin, the contraction rate is greater than that of film-forming treatment solutions that contain only a volatile component. Thus, particles are removed by stronger force. Especially, since acrylic resin shows greater curing contraction than other resins such as epoxy resin, containing acrylic resin is effective to provide tensile force to be exerted on the particles.

Substrate cleaning apparatus 7 supplies a removal solution capable of dissolving the topcoat film so that the topcoat film is dissolved and removed along with particles from wafer (W). Accordingly, particles are removed along with the topcoat film from wafer (W).

In the first embodiment, a change in the volume of a film-forming treatment solution is used to remove particles. In doing so, since particles are removed by weaker force compared with a conventional method using physical force, pattern collapse is suppressed. Also, since particles are removed without employing chemical reactions, base film erosion caused by etching or the like is also suppressed. Accordingly, using the substrate cleaning method of the first embodiment, particles attached to wafer (W) are removed, and pattern collapse or base film erosion is suppressed.

According to the substrate cleaning method of the first embodiment, it is easier to remove small-diameter particles and particles that have penetrated into spaces between patterns, which are difficult to remove by substrate cleaning methods using physical force.

In the first embodiment, an alkaline removal solution is used to enhance the efficiency of removing particles. In particular, an alkaline developing solution is used as a removal solution. Alkaline developing solutions are not limited to any specific type, as long as they contain at least one of ammonium, tetramethyl ammonium hydroxide (TMAH) and choline-based solutions.

When an alkaline developing solution is supplied, surfaces of wafer (W) and patterns are charged with zeta potential of the same polarity (here, it is negative) as that on surfaces of particles as shown in FIG. 2C. The particles removed from wafer (W) and the like due to a change in volume of the topcoat solution will repel wafer (W) and the like when the particles are charged with zeta potential of the same polarity as that on wafer (W) and the like. Accordingly, the particles are prevented from reattaching to wafer (W) and the like.

After particles are removed from wafer (W) and the like using volume contraction of a topcoat solution, an alkaline developing solution is supplied so that the topcoat film is dissolved, while wafer (W) and the like are charged with zeta potential of the same polarity as that on particles. Accordingly, reattachment of particles is prevented, and the efficiency of removing particles is further enhanced.

In the above, using volume contraction of a topcoat solution has been described as a method for removing particles. However, as long as strain (tensile force) is generated by a change in the volume of a treatment solution, methods for removing particles are not limited to using volume contraction. Namely, if the volume of a resin contained in a topcoat solution swells when the resin cures or solidifies, the volume of the topcoat solution also swells as the resin solidifies or cures. Accordingly, the strain (tensile force) caused by such swelling can be used to remove particles.

The film-forming treatment solution such as a topcoat solution supplied to wafer (W) ultimately will be entirely removed from wafer (W). Therefore, after cleaning is completed, wafer (W) retains the initial state it had before the topcoat solution was applied; specifically, the surface where circuits are formed is exposed.

Structure and Operation of Substrate Cleaning Apparatus

Figure 3:
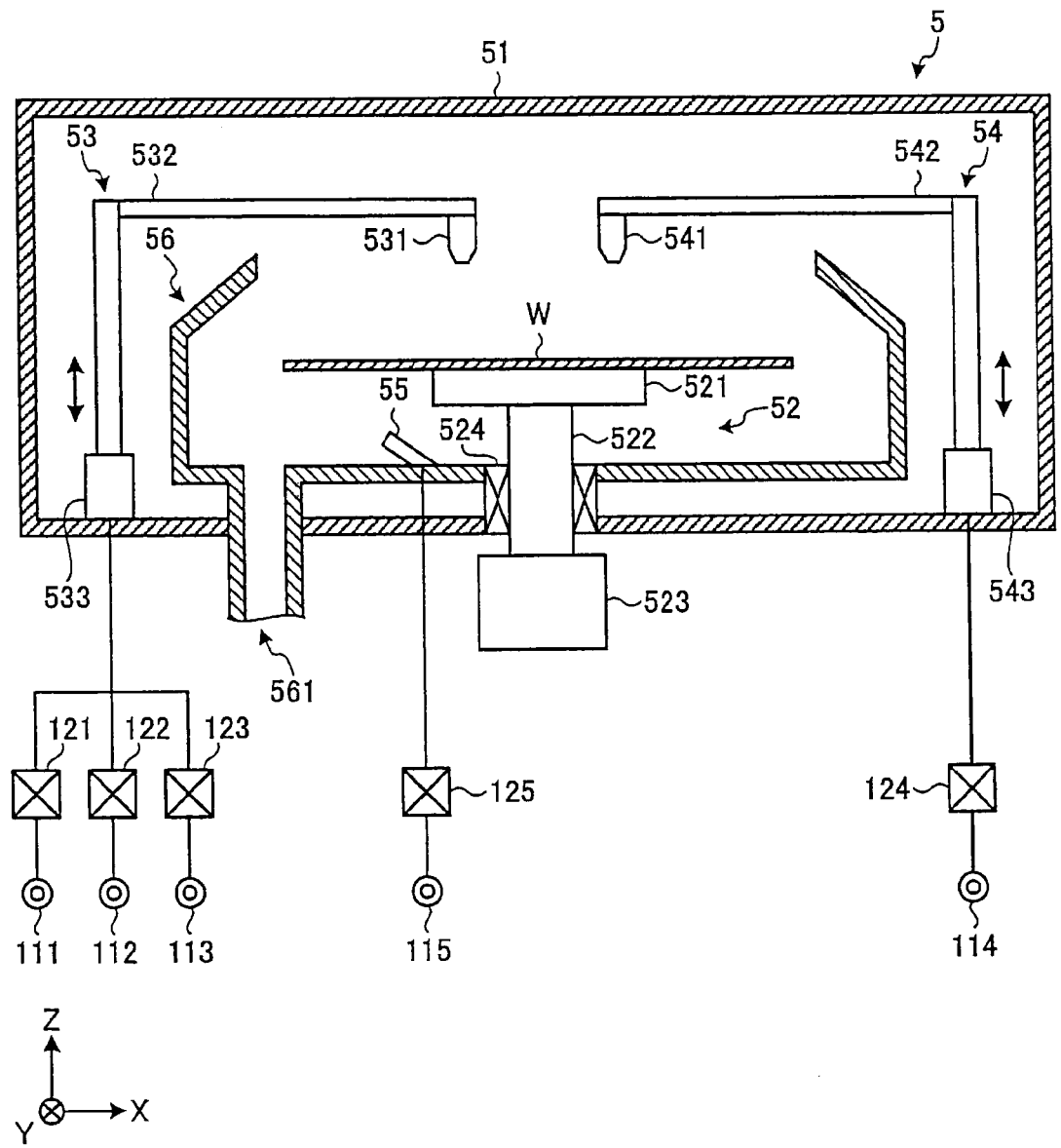
FIG. 3 is a view schematically showing the structure of a first processing apparatus.

The structure and operation of substrate cleaning apparatus 7 are described in detail. The structure of first processing apparatus 5 is described with reference to FIG. 3. FIG. 3 is a schematic view showing the structure of first processing apparatus 5. FIG. 3 shows the elements to describe the characteristics of first processing apparatus 5, and other general elements are omitted from the drawing.

As shown in FIG. 3, first substrate holding device 52, solution supply devices (53, 54, 55) and collection cup 56 are provided in first chamber 61 of first processing apparatus 5.

First substrate holding device 52 is equipped with suction-holding device 521 to suction-hold wafer (W), support member 522 to support suction-holding device 521, and driver portion 523 to rotate support member 522.

Suction-holding device 521 is connected to a suction apparatus such as a vacuum pump and holds wafer (W) horizontally by suctioning the lower surface of wafer (W) using negative pressure generated when air is sucked out by the suction apparatus. For such suction-holding device 521, a porous chuck may be used, for example.

Support member 522 is formed beneath suction-holding device 521 and supported by bearing 524 so as to be rotatable in first chamber 51 and collection cup 56.

Driver portion 523 is provided under support member 522 and rotates support member 522 around a vertical axis. By so setting, wafer (W) suction-held by suction-holding device 521 is rotated.

Solution supply devices (53, 54) move from a position off wafer (W) to a position above wafer (W), and supply treatment solutions onto the main surface of wafer (W) held by first substrate holding device 52. More specifically, solution supply devices (53, 54) have nozzles (531, 541) to discharge treatment solutions, arms (532, 542) to horizontally support nozzles (531, 541), and oscillating elevator mechanisms (533, 543) to oscillate, elevate and lower arms (532, 542).

Solution supply device 53 supplies onto wafer (W) a predetermined chemical solution (DHF, here), DIW (pure water) as a rinsing solution, and IPA (isopropyl alcohol) as a drying solvent. DHF is diluted hydrogen fluoride.

More specifically, solution supply device 53 is connected to DHF supply source 111 through valve 121, DIW supply source 112 through valve 122, and IPA supply source 113 through valve 123. Solution supply device 53 supplies DHF, DIW and IPA respectively provided from DHF supply source 111, DIW supply source 112 and IPA supply source 113, onto the main surface of wafer (W).

Solution supply device 54 supplies wafer (W) with a topcoat solution as a film-forming treatment solution. More specifically, solution supply device 54 is connected to film-forming treatment solution supply source 114 through valve 124, and supplies the topcoat solution provided from film-forming treatment solution supply source 114 to the main surface of wafer (W).

Solution supply device 55 is formed at the bottom of collection cup 56, for example, and supplies an alkaline developing solution toward the lower-surface side periphery of wafer (W). In particular, removal-solution supply source 115 is connected to solution supply device 55 through valve 125, and an alkaline developing solution provided from removal-solution supply source 115 is supplied to the lower-surface side periphery of wafer (W). Solution supply device 55 is used to remove a topcoat solution or topcoat film attached to a bevel portion or periphery of wafer (W). The details are described later.

Collection cup 56 is positioned to surround first substrate holding device 52 so as to prevent treatment solutions from being splashed. Drain port 561 is formed at the bottom of collection cup 56, and treatment solutions collected in collection cup 56 are drained from first processing apparatus 5 through drain port 561.

Figure 4:
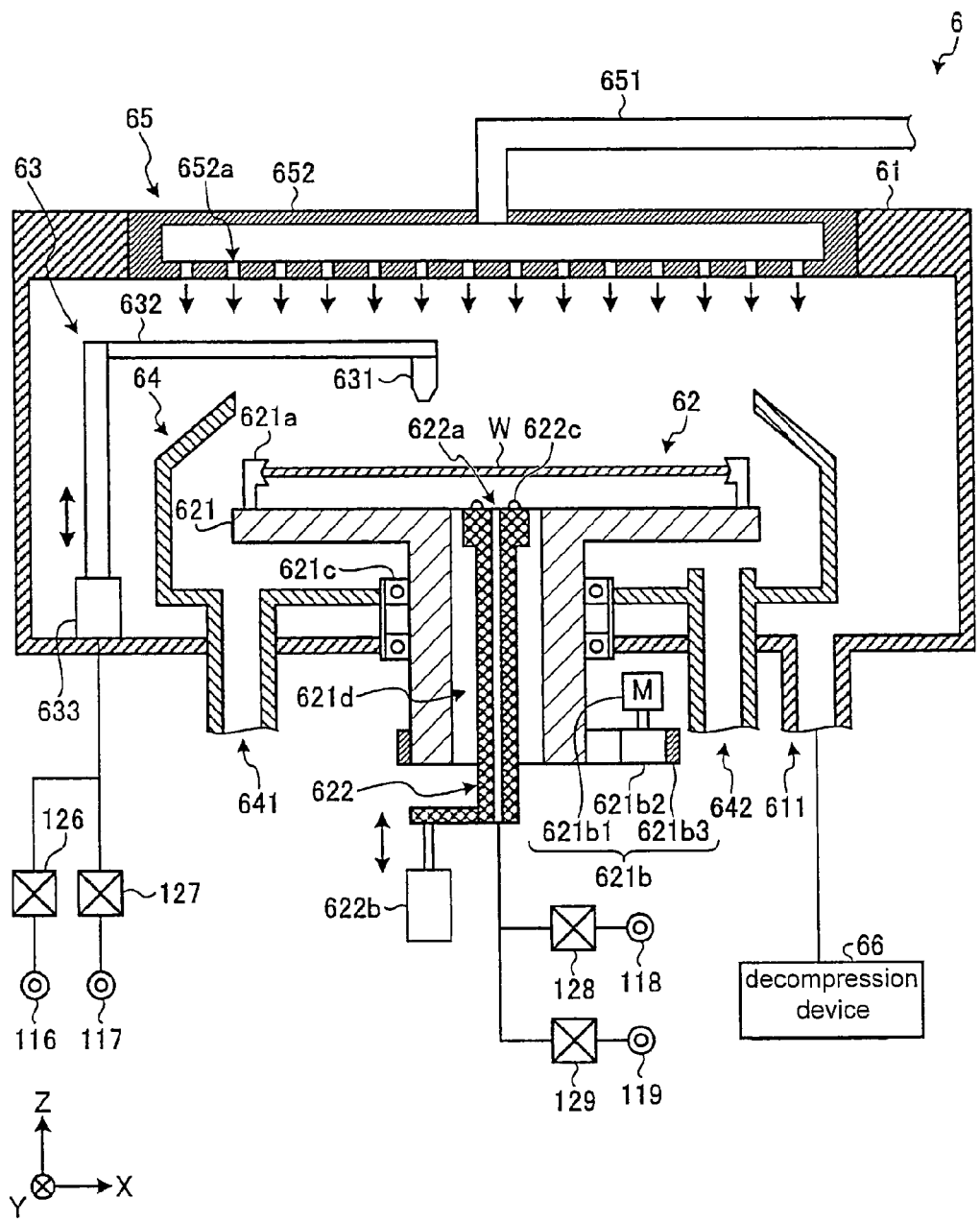
FIG. 4 is a view schematically showing the structure of a second processing apparatus.

The structure of second processing apparatus 6 is described with reference to FIG. 4. FIG. 4 is a view schematically showing the structure of second processing apparatus 6.

As shown in FIG. 4, second substrate holding device 62, solution supply device 63, collection cup 64 and current forming unit 65 are provided in second chamber 61 of second processing apparatus 6.

Second substrate holding device 62 has rotatable holding mechanism 621 to hold wafer (W) while allowing wafer (W) to rotate, and has flowing-substance supply portion 622 inserted into hollow portion (621*d*) of rotatable holding mechanism 621 to supply gas to the lower surface of wafer (W).

Rotatable holding mechanism 621 is provided in substantially the center of second chamber 61. On the top surface of rotatable holding mechanism 621, holder portion (621*a*) is provided to hold the periphery of wafer (W). Wafer (W) is horizontally held by holder portion (621*a*) so that it is separated slightly from the top surface of rotatable holding mechanism 621.

Rotatable holding mechanism 621 is equipped with driver mechanism (621*b*) and is rotated around the vertical axis by driver mechanism (621*b*). In particular, driver mechanism (621*b*) has motor (621*b*1), pulley (621*b*2) attached to the output axis of motor (621*b*1), and belt (621*b*3) wound on pulley (621*b*2) and the periphery of rotatable holding mechanism 621.

Driver mechanism (621*b*) rotates pulley (621*b*2) when motor (621*b*1) is running. Rotation of pulley (621*b*2) is transferred to rotatable holding mechanism 621 by belt (621*b*3) so that rotatable holding mechanism 621 rotates around the vertical axis. When rotatable holding mechanism 621 rotates, wafer (W) held by rotatable holding mechanism 621 also rotates with rotatable holding mechanism 21. Rotatable holding mechanism 621 is supported by bearing (621*c*) so as to be rotatable in collection cup 64 and in second chamber 61.

Flowing-substance supply portion 622 is a long member inserted into hollow portion (621*d*) formed in the center of rotatable holding mechanism 621. Channel (622*a*) is formed in flowing-substance supply portion 622. N2 gas supply source 118 is connected through valve 128, and SC1 supply source 119 through valve 129, to channel (622*a*). Flowing-substance supply portion 622 supplies N2 gas and SC1 (ammonia/hydrogen peroxide solution), respectively provided from N2 gas supply source 118 and SC1 supply source 119, to the lower surface of wafer (W) through channel (622*a*).

N2 gas supplied through valve 128 is high-temperature N2 gas (approximately 90° C., for example) and is used in a vaporization acceleration process as described later.

Flowing-substance supply portion 622 is also used to transfer wafer (W). More specifically, at the base of flowing-substance supply portion 622, elevator mechanism (622*b*) is provided to vertically move flowing-substance supply portion 622. In addition, support pin (622*c*) to support wafer (W) is provided on the upper surface of flowing-substance supply portion 622.

When second substrate holding device 62 receives wafer (W) from substrate transfer device 31 (see FIG. 1), flowing-substance supply portion 622 is elevated by elevator mechanism (622*b*) and wafer (W) is put on the upper portion of support pin (622*c*). Then, second substrate holding device 62 lowers flowing-substance supply portion 622 to a predetermined position so that wafer (W) is transferred to holder portion (621*a*) of rotatable holding mechanism 621. In addition, when second substrate holding device 62 transfers treated wafer (W) to substrate transfer device 31, flowing-substance supply portion 622 is elevated by elevator mechanism (622*b*) so that wafer (W) supported by holder portion (621*a*) is placed on support pin (622*c*). Then, second substrate holding device 62 transfers wafer (W) placed on support pin (622*c*) to substrate transfer device 31.

Solution supply device 63 moves from a position off wafer (W) to a position above wafer (W), and supplies treatment solutions onto the main surface of wafer (W) held by second substrate holding device 62. Solution supply device 63 has nozzle 631 to discharge a treatment solution, arm 632 to horizontally support nozzle 631 and oscillating elevator mechanism 633 to oscillate, elevate and lower arm 632, the same as solution supply devices (53, 54) of first processing apparatus 5.

Solution supply device 63 supplies an alkaline developing solution as a removal solution and DIW as a rinsing solution to the main surface of wafer (W). More specifically, solution supply device 63 is connected to removal-solution supply source 116 through valve 126 and to DIW supply source 117 through valve 127. An alkaline developing solution and DIW provided from those supply sources are supplied to the main surface of wafer (W).

Collection cup 64 is positioned to surround rotatable holding mechanism 621 to prevent treatment solutions from being splashed. Drain port 641 is formed at the bottom of collection cup 64, and treatment solutions collected in collection cup 64 are drained from second processing apparatus 6 through drain port 641. In addition, exhaust port 642 is formed at the bottom of collection cup 64, and N2 gas supplied from flowing-substance supply portion 622, or gas supplied from current forming unit 65 to second processing apparatus 6, is discharged from second processing apparatus 6 through exhaust port 642.

Exhaust port 611 is formed at the bottom of second chamber 61, and decompression device 66 is connected to exhaust port 611. Decompression device 66 is a vacuum pump, for example, and pumps out air from second chamber 61 to reduce the pressure.

Current forming unit 65 is installed on the ceiling of second chamber 61 and generates downflow current in second chamber 61. More specifically, current forming unit 65 has downflow gas supply pipe 651 and buffer room 652 connected to downflow gas supply pipe 651. Downflow gas supply pipe 651 is connected to the downflow gas supply source (not shown). At the bottom of buffer room 652, multiple connection holes (652a) are formed to connect buffer room 652 and second chamber 61.

Current forming unit 65 supplies downflow gas (clean gas, dry gas, etc.) to buffer room 652 via downflow gas supply pipe 651. Through multiple connection holes (652a), current forming unit 65 supplies second chamber 61 with the downflow gas provided to buffer room 652. Accordingly, downflow current is formed in second chamber 61. Downflow gas in second chamber 61 is discharged from exhaust ports (642, 611) to the outside of second processing apparatus 6.

Figure 6A:
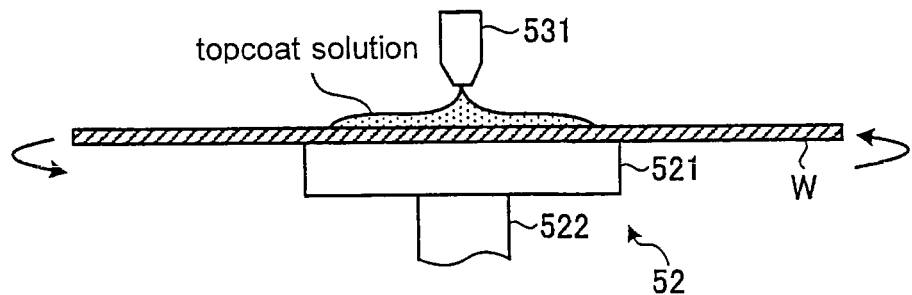
FIG. 6A is a view illustrating an operation performed by the first processing apparatus.
Figure 6B:
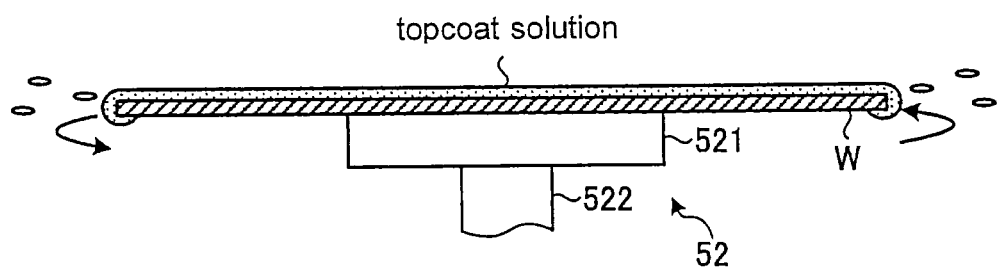
FIG. 6B is a view illustrating an operation performed by the first processing apparatus.
Figure 6C:
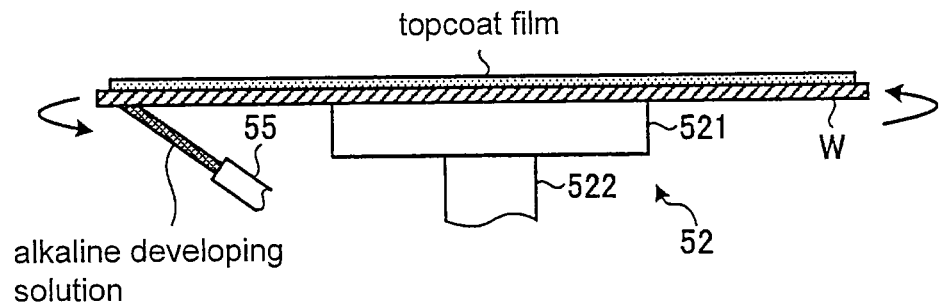
FIG. 6C is a view illustrating an operation performed by the first processing apparatus.
Figure 7A:
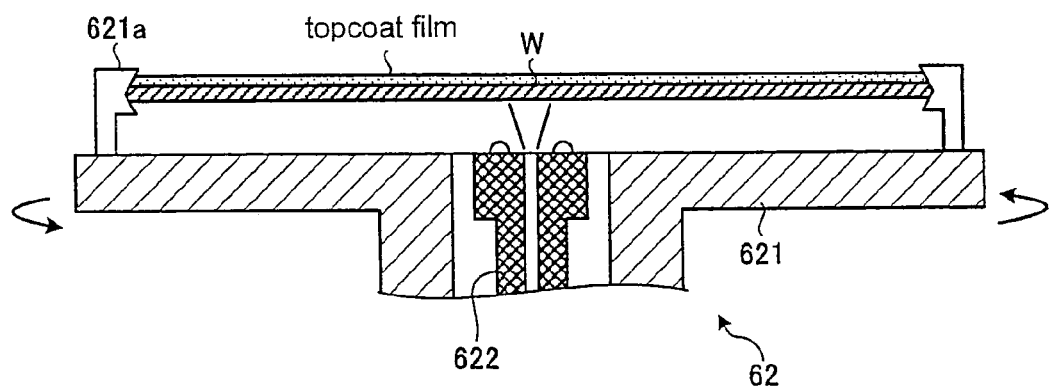
FIG. 7A is a view illustrating an operation performed by the second processing apparatus.
Figure 7B:
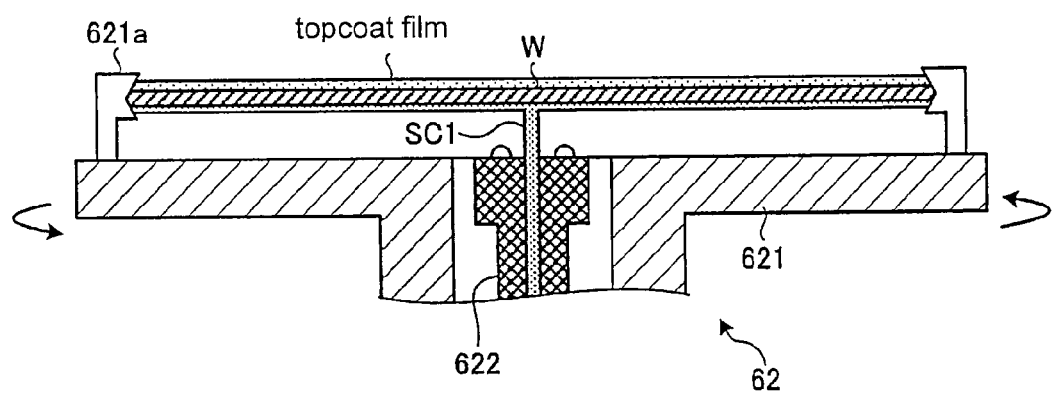
FIG. 7B is a view illustrating an operation performed by the second processing apparatus.

Specific operations of substrate cleaning apparatus 7 are described. FIG. 5 is a flowchart showing the processes of a substrate cleaning process carried out by substrate cleaning apparatus 7. Also, FIGS. 6A~6C are views illustrating operations performed by first processing apparatus 5; and FIGS. 7A, 7B and 8A~8C are views illustrating operations performed by second processing apparatus 6. In particular, FIGS. 6A~6C each show an example of film-forming treatment solution supply process (step (S105) in FIG. 5), FIG. 7A shows an example of vaporization acceleration process (step (S108) in FIG. 5), and FIG. 7B shows an example of lower-surface cleaning process (step (S109) in FIG. 5).

Figure 8A:
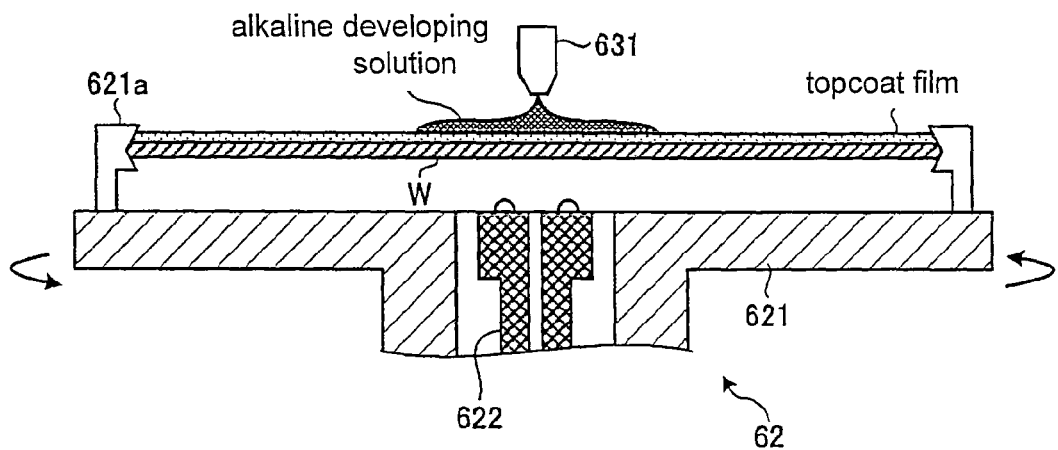
FIG. 8A is a view illustrating an operation performed by the second processing apparatus.
Figure 8B:
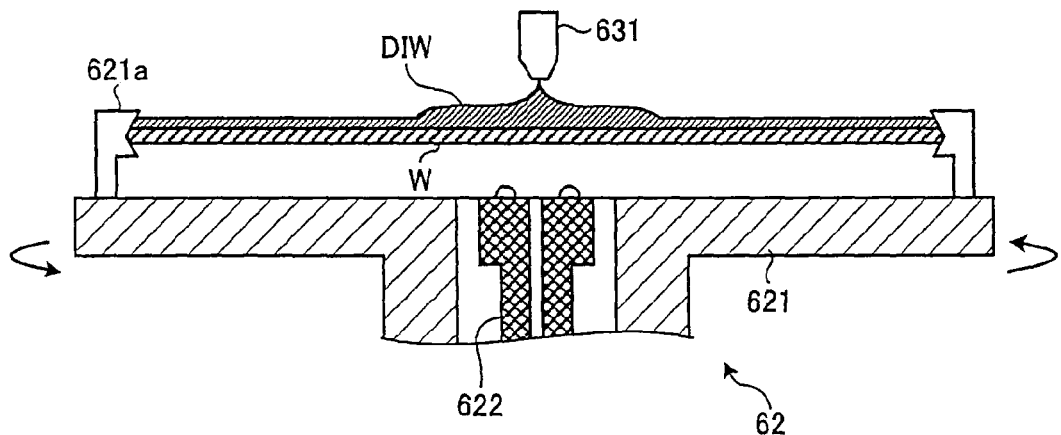
FIG. 8B is a view illustrating an operation performed by the second processing apparatus.
Figure 8C:
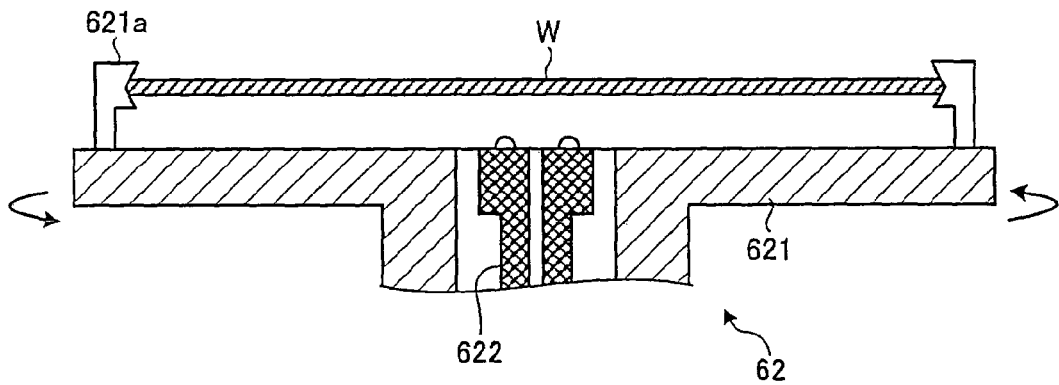
FIG. 8C is a view illustrating an operation performed by the second processing apparatus.

FIG. 8A shows an example of a removal-solution supply process (step (S110) in FIG. 5), FIG. 8B shows an example of a rinsing process (step (S111) in FIG. 5), and FIG. 8C shows an example of a drying process (step (S112) in FIG. 5). Each step in FIG. 5 is performed according to commands from control apparatus 8.

In substrate cleaning apparatus 7 of the first embodiment, steps from a first loading process (step S101) through a first unloading process (step S106) are conducted in first processing apparatus 5, and steps from a second loading process (step S107) through a second unloading process (step S113) are conducted in second processing apparatus 6.

As shown in FIG. 5, first, a first loading process is conducted in first processing apparatus 5 (step S101). In the first loading process, collection cup 56 is lowered and substrate transfer device 31 places wafer (W) on suction-holding device 521, and then wafer (W) is suction-held by suction-holding device 521. At this time, wafer (W) is held by suction-holding device 521 with its circuit-pattern surface facing upward. Then, first substrate holding device 52 is rotated by driver portion 523. Accordingly, wafer (W) rotates with first substrate holding device 52 while it is being held horizontally by first substrate holding device 52.

Next, chemical solution treatment is conducted in first processing apparatus 5 (step S102). In such chemical solution treatment, nozzle 531 of solution supply device 53 is positioned above the center of wafer (W). Then, DHF as a cleaning solution is supplied from nozzle 531 onto the main surface of wafer (W). The DHF supplied to the main surface of wafer (W) is spread over the main surface of wafer (W) by centrifugal force generated as wafer (W) rotates. Accordingly, unwanted film on the entire main surface of wafer (W) is dissolved by DHF. Namely, when the surface of base film on the main surface of wafer (W) or surfaces of particles are dissolved by DHF, the adhesive force of particles is weakened, and particles are more likely to be removed.

The chemical solution used in chemical solution treatment is not limited to DHF as long as it is a chemical solution that dissolves wafer (W), material formed on wafer (W), or foreign substances attached to wafer (W). Here, "material formed on wafer (W)" means base film on wafer (W), for example. "Foreign substances attached to wafer (W)" are, for example, particles of metallic contaminants. Also, other than DHF, examples of such a chemical solution are ammonium fluoride, hydrochloric acid, sulfuric acid, hydrogen peroxide solution, phosphoric acid, acetic acid, nitric acid, ammonium hydroxide and the like.

Next, a rinsing process is conducted to rinse the main surface of wafer (W) using DIW (step S103) in first processing apparatus 5. In such a rinsing process, valve 122 (see FIG. 3) is opened for a predetermined duration to supply DIW from nozzle 531 of solution supply device 53 to the main surface of rotating wafer (W) to wash off DHF remaining on wafer (W).

Next, in first processing apparatus 5, a displacement process is conducted (step S104). In the displacement process, valve 123 (see FIG. 3) is opened for a predetermined duration to supply IPA from nozzle 531 of solution supply device 53 to the main surface of rotating wafer (W) so as to displace DIW on wafer (W) with IPA. After that, the rotation of wafer (W) is turned off while IPA remains on wafer (W). After the displacement process is completed, nozzle 531 moves to a position off wafer (W).

Next, a process for supplying a film-forming treatment solution is conducted in first processing apparatus 5 (step S105). In the film-forming treatment solution supply process, nozzle 541 of solution supply device 54 is positioned above the center of wafer (W). Then, as shown in FIG. 6A, a topcoat solution as a film-forming treatment solution is supplied from nozzle 531 onto the main surface of wafer (W), which is the circuit-pattern surface where no resist film is formed.

The topcoat solution supplied onto the main surface of wafer (W) is spread over the main surface of wafer (W) by centrifugal force generated as wafer (W) rotates. Accordingly, solution film of the topcoat solution is formed on the entire main surface of wafer (W) as shown in FIG. 6B. At this time, the wettability of the main surface of wafer (W) is enhanced by IPA supplied onto wafer (W) in step (S105). Thus, the topcoat solution is more likely to be spread over the main surface of wafer (W) in a short period of time. Accordingly, the amount of the topcoat solution to be supplied is reduced, and the processing duration of a film-forming treatment solution supply process is shortened.

The topcoat solution solidifies when the volatile component is vaporized as wafer (W) rotates. Accordingly, a topcoat film is formed on the entire main surface of wafer (W). When the film-forming treatment solution supply process is finished, nozzle 531 moves to a position off wafer (W). Here, IPA is supplied to wafer (W) to enhance wettability, but an organic solvent to be supplied to wafer (W) may be any organic solvents other than IPA.

The topcoat solution supplied onto the main surface of wafer (W) is slightly spilled over onto the lower surface of wafer (W) from the periphery of wafer (W) as shown in FIG. 6B. Thus, topcoat film is also formed on the bevel portion or the lower-surface side periphery of wafer (W).

In first processing apparatus 5, after a topcoat solution is supplied to the main surface of wafer (W) from nozzle 531, a removal solution (an alkaline developing solution, here) is supplied to the lower-surface side periphery of wafer (W) from solution supply device 55 as shown in FIG. 6C. The alkaline developing solution supplied onto the lower-surface side periphery of wafer (W) is spilled over onto the main-surface side periphery from the bevel portion of wafer (W). Thus, the topcoat film or topcoat solution attached to the lower-surface side periphery, bevel portion and main-surface side periphery of wafer (W) is removed. Then, the rotation of wafer (W) is turned off.

Next, a first unloading process is conducted in first processing apparatus 5 (step S106). In the first unloading process, collection cup 56 is lowered, and wafer (W) held by first substrate holding device 52 is transferred to substrate transfer device 31. Wafer (W) is unloaded from first processing apparatus 5 as the topcoat solution has solidified and topcoat film has been formed on the circuit-pattern surface.

Next, in second processing apparatus 6, a second loading process is conducted (step S107). In the second loading process, after substrate transfer device 31 has placed wafer (W) on support pin (622*c*) of flowing-substrate supply device 622, wafer (W) is held by holder portion (621*a*) of rotatable holding mechanism 621. At this time, wafer (W) is held by holder portion (621*a*) with its circuit-pattern surface facing upward. Then, rotatable holding mechanism 621 is rotated by driver mechanism (621*b*). Accordingly, wafer (W) rotates with rotatable holding mechanism 621 while it is held horizontally by rotatable holding mechanism 621.

Next, a vaporization acceleration process is conducted in second processing apparatus 6 (step S108). In the vaporization acceleration process, vaporization of the volatile component contained in the topcoat solution that forms film on the entire main surface of wafer (W) is further accelerated. More specifically, valve 128 (see FIG. 4) is opened for a predetermined duration to supply high-temperature N2 gas from flowing-substance supply portion 622 to the lower surface of rotating wafer (W) as shown in FIG. 7A. Accordingly, wafer (W) as well as the topcoat solution is heated to accelerate vaporization of the volatile component.

The pressure in second chamber 61 is reduced by decompression device 66 (see FIG. 4). By doing so, vaporization of the volatile component is also accelerated. Moreover, downflow gas is supplied from current forming unit 65 during the substrate cleaning process. When humidity in current forming unit 65 is lowered by downflow gas, vaporization of the volatile component is also accelerated.

When the volatile component is vaporized, the topcoat solution solidifies or cures while its volume contracts and topcoat film is formed. Accordingly, particles attached to wafer (W) and the like are removed from wafer (W) and the like.

Using substrate cleaning apparatus 7, the duration until a film-forming treatment solution solidifies or cures is reduced by accelerating vaporization of the volatile component contained in the film-forming treatment solution. Also, when wafer (W) is heated, since curing contraction of the synthetic resin contained in the film-forming treatment solution is facilitated, the contraction rate of the film-forming treatment solution is further heightened, compared with an example when wafer (W) is not heated.

Flowing-substance supply portion 622, decompression device 66 and current-forming unit 65 are examples of a "vaporization acceleration device." Here, second processing apparatus 6 is equipped with flowing-substance supply portion 622, decompression device 66 and current-forming unit 65 as the vaporization acceleration device. However, it is an option for second processing apparatus 6 to be structured with any one of those.

So far, an example has been shown in which second processing apparatus 6 performs a vaporization acceleration process. However, it is an option to omit such a vaporization acceleration process. Namely, second processing apparatus 6 may be put in a standby mode until a topcoat solution is naturally hardened or cured. It is also an option to turn off the rotation of wafer (W) while the topcoat solution is vaporized. Alternatively, the vaporization of a topcoat solution may be accelerated by rotating wafer (W) at a speed that prevents the topcoat solution from being totally shaken off so as not to expose the main surface of wafer (W).

Next, in second processing apparatus 6, a lower-surface cleaning process is conducted (step S109). In the lower-surface cleaning process, SC1 is supplied to the lower surface of rotating wafer (W) from flowing-substance supply portion 622 by opening valve 129 (see FIG. 4) for a predetermined duration (see FIG. 7B). By doing so, the lower surface of wafer (W) is cleaned. SC1 supplied to the lower surface of wafer (W) is drained to a drain line through a diverter valve (not shown) from drain port 641 of collection cup 64. Flowing-substance supply portion 622 is also an example of a lower-surface cleaning device, which cleans the lower surface of wafer (W) held by holder portion (621*a*).

In substrate cleaning apparatus 7 of the first embodiment, a process for supplying a film-forming treatment solution is set to be conducted in first processing apparatus 5 equipped with suction-holding device 521, which suction-holds the lower surface of wafer (W). Therefore, application of the topcoat solution is unlikely to miss the periphery of wafer (W), compared with an example in which the periphery of wafer (W) is held by a type of substrate holding device such as second substrate holding device 62 in second processing apparatus 6. Also, since the topcoat solution is not attached to the substrate holding device, wafer (W) is unlikely to be contaminated by being held by the substrate holding device with attached topcoat solution.

In substrate cleaning apparatus 7 of the first embodiment, the lower-surface cleaning process is set to be conducted in second processing apparatus 6 equipped with rotatable holding mechanism 621 to hold the periphery of wafer (W). Thus, contaminants on the lower surface of wafer (W), especially the contaminants from suction-holding device 521 of first processing apparatus 5, are removed, In substrate cleaning apparatus 7 of the first embodiment, the lower surface of wafer (W) is set to be cleaned as the main surface of wafer (W) is coated with solidified or cured topcoat solution. Thus, even if the cleaning solution is spun off during the lower-surface cleaning process, the main surface of wafer (W) is prevented from being contaminated by the cleaning solution. Also, the main surface of wafer (W) is prevented from being contaminated when the cleaning solution is spilled over onto the main surface.

Here, an example has been described in which a lower-surface cleaning process is conducted after a vaporization acceleration process. However, the lower-surface cleaning process may be conducted after a second loading process and before the vaporization acceleration process.

Next, in second processing apparatus 6, a removal-solution supply process is conducted (step S110). In the removal-solution supply process, nozzle 631 is positioned above the center of wafer (W) as shown in FIG. 8A. Then, valve 126 (see FIG. 4) is opened for a predetermined duration to supply an alkaline developing solution as a removal solution onto rotating wafer (W) from nozzle 631. By doing so, the topcoat film formed on wafer (W) is dissolved and removed.

During that time, since wafer (W) and the like are charged with zeta potential of the same polarity as that on particles, wafer (W) and the like repel the particles. Thus, reattachment of the particles onto wafer (W) and the like is prevented.

The removal solution spun off from wafer (W) by centrifugal force is drained from drain port 641 of collection cup

64 to a collection line through a valve (not shown). The removal solution drained to the collection line is recycled.

It is an option for drain port 641 to be kept connected to the drain line for a predetermined duration from when the supply of the removal solution is started until the topcoat film is sufficiently removed, and then to be switched to the collection line. In so setting, the topcoat solution is prevented from being mixed into the recyclable removal solution.

Next, in second processing apparatus 6, a rinsing process is conducted by using DIW to rinse the main surface of wafer (W) (step S111). In the rinsing process, valve 127 (see FIG. 4) is opened for a predetermined duration to supply DIW to the main surface of rotating wafer (W) from nozzle 631 of solution supply device 63 as shown in FIG. 8B. Accordingly, the topcoat film or the alkaline developing solution remaining on wafer (W) is washed off.

In particular, DIW supplied onto wafer (W) is spread over wafer (W) as wafer (W) rotates while being spun off from wafer (W). Particles floating in the dissolved topcoat film or in the alkaline developing solution are removed from wafer (W) along with DIW during the rinsing process. At that time, the air in second chamber 61 is promptly emitted by a downflow current formed in current-forming unit 65. When the rinsing process is completed, nozzle 631 moves to a position off wafer (W).

In second processing apparatus 6, a drying process is conducted (step S112). In the drying process, the rotation speed of wafer (W) is increased for a predetermined duration so that DIW remaining on the main surface of wafer (W) is spun off, and wafer (W) is dried (see FIG. 8C). Then, the rotation of wafer (W) is turned off.

In second processing apparatus 6, a second unloading process is conducted (step S113). In the substrate unloading process, flowing-substance supply portion 622 is elevated by elevator mechanism (622*b*) (see FIG. 4) and wafer (W) held by holder portion (621*a*) is placed on support pin (622*c*). Then, wafer (W) on support pin (622*c*) is transferred to substrate transfer device 31. When such a substrate unloading process is finished, substrate cleaning treatment on wafer (W) is completed. Wafer (W) is unloaded from second processing apparatus 6 with its circuit-pattern surface being exposed.

In substrate cleaning apparatus 7 of the first embodiment, the lower surface of wafer (W) is set to be cleaned after the entire main surface of wafer (W) is coated with a film formed as the topcoat solution solidifies or cures through vaporization of the volatile component. Thus, the lower surface of wafer (W) is cleaned while contamination of the main surface of wafer (W) is prevented.

In substrate cleaning apparatus 7 of the first embodiment, a vaporization acceleration process is set to be conducted before a lower-surface cleaning process is conducted. Thus, the topcoat solution certainly solidifies or cures to form a topcoat film prior to starting the lower-surface cleaning process. Accordingly, the main surface of wafer (W) is surely protected.

In substrate cleaning apparatus 7 of the first embodiment, a topcoat solution as a treatment solution containing a volatile component and forming a film on the entire main surface of a substrate is supplied to wafer (W). Also, in substrate cleaning apparatus 7 of the first embodiment, an alkaline developing solution, as a removal solution capable of dissolving the entire film formed when the topcoat solution solidifies or cures through vaporization of the volatile component, is supplied to wafer (W). Therefore, according to the first embodiment, particles attached to wafer (W) are removed, and pattern collapse or erosion of base film is prevented.

In substrate cleaning apparatus 7 of the first embodiment, different substrate holding devices are used respectively in a film-forming treatment solution supply process and a removal-solution supply process. In particular, since a film-forming treatment solution supply process is conducted in first processing apparatus 5 equipped with suction-holding device 521 that suction-holds the lower surface of wafer (W), application failure of a topcoat solution to the periphery of wafer (W) or attachment of the topcoat solution to the substrate holding device is prevented. In addition, since a removal-solution supply process is conducted in second processing apparatus 6 equipped with rotatable holding mechanism 621 to hold the periphery of wafer (W), the lower surface of wafer (W) is cleaned before the removal-solution supply process, and contamination from suction-holding device 521 of first processing apparatus 5 is removed. Also, attachment of the topcoat solution to the second holding device is prevented.

In substrate cleaning apparatus 7 of the first embodiment, an alkaline removal solution has been used. Accordingly, wafer (W) and the like are charged with zeta potential of the same polarity as that on particles, thus preventing the particles from reattaching to wafer (W). The efficiency of removing particles is enhanced.

In the first embodiment above, a first holding device equipped in first processing apparatus 5 is a vacuum chuck to suction-hold wafer (W). However, the first holding device of first processing apparatus 5 is not limited to a vacuum chuck. For example, it may be a mechanical chuck to hold the periphery of wafer (W), the same as second substrate holding device 62 equipped in second processing apparatus 6. Alternatively, it may also be such a holding device that holds the lower-surface side periphery of wafer (W) (namely, simply to place wafer (W) thereon).

In the first embodiment above, after chemical treatment is conducted (step (S102) in FIG. 5), a rinsing process and a displacement process (steps (S103, S104) in FIG. 5) are conducted, followed by a film-forming treatment solution supply process (step (S105) in FIG. 5). However, it is an option for first processing apparatus 5 to conduct a film-forming treatment solution supply process without conducting a chemical treatment process, a rinsing process and a displacement process.

Second Embodiment

Figure 9:
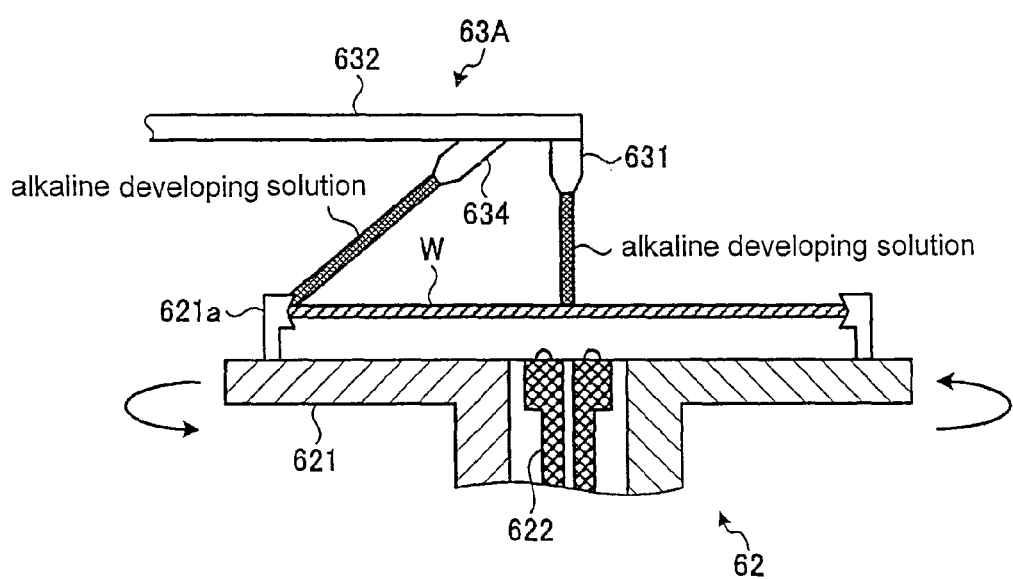
FIG. 9 is a view schematically showing the structure of a second processing apparatus according to a second embodiment.

The structure of a substrate cleaning apparatus is not limited to that in the first embodiment. Another structure of a substrate cleaning apparatus is described in the following with reference to FIG. 9. FIG. 9 is a schematic view illustrating the structure of a substrate cleaning apparatus according to a second embodiment. In the following, regarding a portion corresponding to or identical to what has been already described above, the same reference number is applied and redundant descriptions are omitted here.

As shown in FIG. 9, a second processing apparatus of the second embodiment has solution supply device (63A) in place of solution supply device 63 equipped in second processing apparatus 6 of the first embodiment (see FIG. 4).

Solution supply device (63A) further includes nozzle 634 in addition to nozzle 631. Nozzle 634 is diagonally supported by arm 632, and its discharge port is pointed toward the periphery of wafer (W) when nozzle 631 is positioned above the center of wafer (W). Nozzle 634 is an example of a third solution supply device.

Nozzle 634 is connected to removal-solution supply source 116 (see FIG. 4) through a valve not shown here. Along the periphery of wafer (W), nozzle 634 discharges an alkaline developing solution provided from removal-solution supply source 116. Accordingly, an alkaline developing solution under sufficient flow rate and velocity to clean holder portion (621a) is supplied to holder portion (621a).

The valve connected to nozzle 634 is a valve different from valve 126 (see FIG. 4) connected to nozzle 631. Therefore, the timing of turning on/off the supply of an alkaline developing solution is controlled separately for nozzle 631 and nozzle 634. Since the rest of the structure is the same as second processing apparatus 6 of the first embodiment, the descriptions are omitted here.

The second processing apparatus of the second embodiment performs a cleaning process of holder portion (621a) using solution supply device (63A) according to commands from control apparatus 8. More specifically, in the above-described removal-solution supply process (step (S110) in FIG. 5), after nozzle 631 is positioned above the center of wafer (W), a valve (not shown) connected to nozzle 634 and valve 126 (see FIG. 4) are opened for a predetermined duration to supply an alkaline developing solution as a removal solution to the periphery of wafer (W) from nozzle 631.

Accordingly, topcoat film attached to holder portion (621a) is dissolved and removed from holder portion (621a). Namely, holder portion (621a) is cleaned.

The valve connected to nozzle 634 is turned off before valve 126 (see FIG. 4) is turned off. By doing so, the supply of the alkaline developing solution from nozzle 634 to holder portion (621a) is turned off prior to stopping the supply of the alkaline developing solution from nozzle 631 to wafer (W).

Accordingly, even if the topcoat film attached to holder portion (621a) is removed and spun over wafer (W) by the alkaline developing solution supplied from nozzle 634, such spun-off topcoat film is prevented from reattaching to wafer (W) by the alkaline developing solution supplied from nozzle 631 and is washed away.

A substrate cleaning apparatus of the second embodiment is further equipped with nozzle 634 to supply an alkaline developing solution to holder portion (621a). Thus, the topcoat film attached to holder portion (621a) is also removed, and contamination or damage to wafer (W) or the raising of dust is prevented.

In the present embodiment, prior to stopping the supply of the alkaline developing solution from nozzle 631 to wafer (W), the supply of the alkaline developing solution from nozzle 634 to holder portion (621a) is turned off. However, the timing of turning off nozzle 634 is not limited to the above. For example, the supply of the alkaline developing solution from nozzle 634 to holder portion (621a) may be turned off before the rinsing process is finished, namely, before the supply of DIW from nozzle 631 to wafer (W) is turned off. In such an example as well, the topcoat film spun off from holder portion (621a) onto wafer (W) is washed off by DIW supplied from nozzle 631, and prevented from reattaching to wafer (W).

It is sufficient as long as the supply of the alkaline developing solution from nozzle 634 to holder portion (621a) is turned off before the supply of the treatment solution (alkaline developing solution or DIW) from nozzle 631 to wafer (W).

Third Embodiment

Figure 10A:
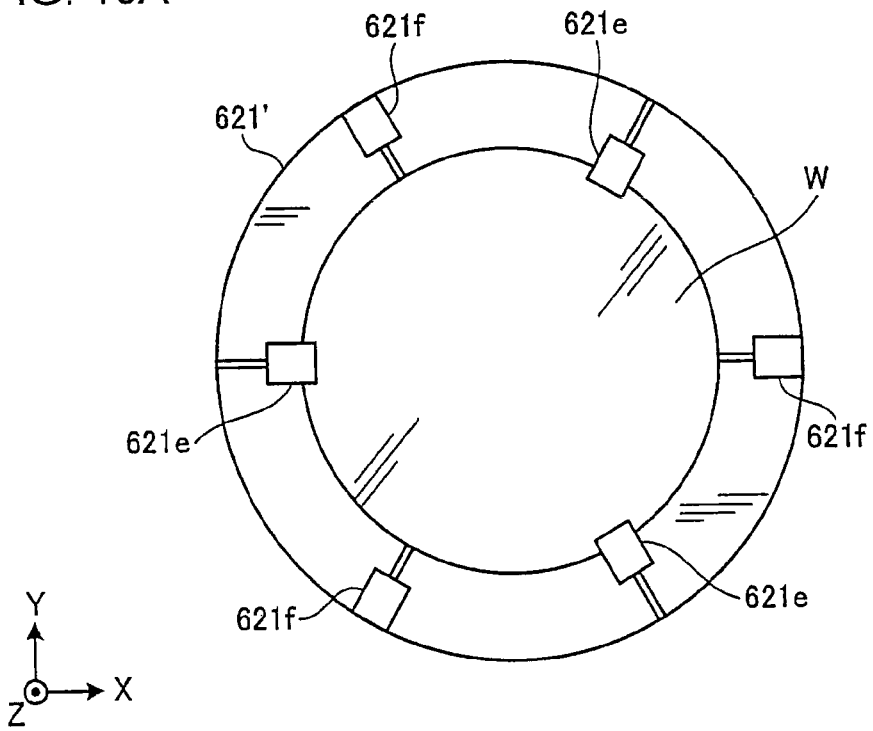
FIG. 10A is a view schematically showing a modified example of a rotatable holding mechanism in the second processing apparatus.
Figure 10B:
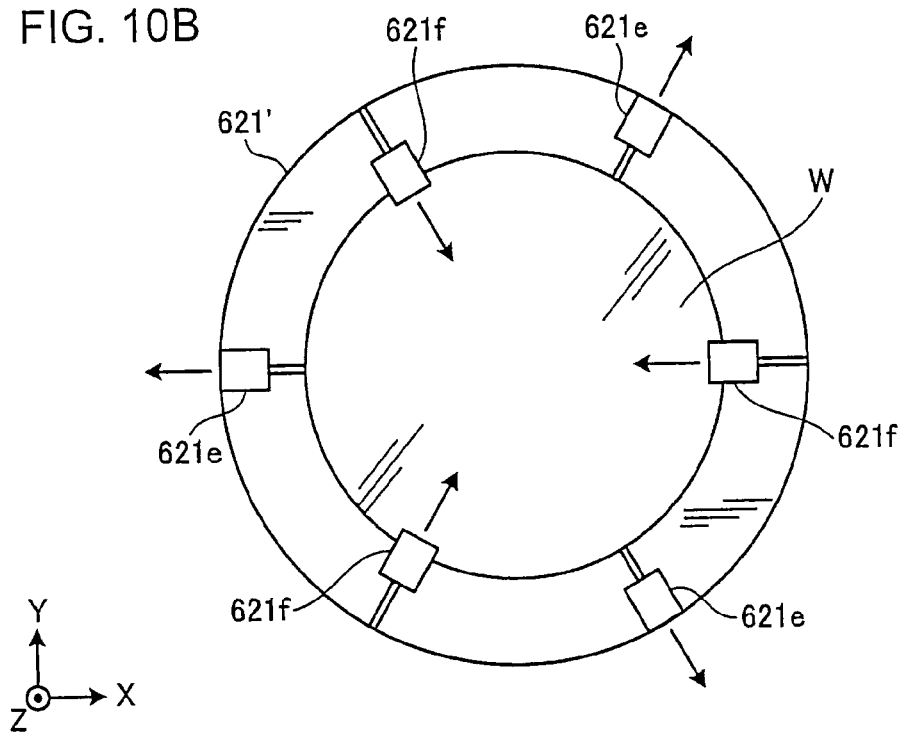
FIG. 10B is a view schematically showing a modified example of the rotatable holding mechanism in the second processing apparatus.

A substrate cleaning apparatus according to a third embodiment is described. FIGS. 10A and 10B are views schematically showing a modified example of a rotatable holding mechanism equipped in the second processing apparatus.

As shown in FIG. 10A, instead of rotatable holding mechanism 621 equipped in second processing apparatus 6 of the first embodiment (see FIG. 4), the second processing apparatus of the third embodiment is equipped with rotatable holding mechanism (621'). Since the rest of the structure is the same as in the second processing apparatus 6, the descriptions are omitted here.

Instead of holder portion (621a) in rotatable holding mechanism 621, rotatable holding mechanism (621') has first holder portion (621e) to hold wafer (W), and second holder portion (621f) that is set to be movable independently of first holder portion (621e).

Multiple first holder portions (621e) are provided at equal intervals along the periphery of wafer (W). Here, three are positioned at an interval of 120 degrees to be movable in a radial direction of wafer (W). In addition, second holder portions (6211) are positioned to have equal intervals between first holder portions (621e), and are movable in a radial direction of wafer (W), the same as in first holder portions (621e).

The second processing apparatus 6 of the third embodiment has two types of holder portions, which are movable independently of each other. The holding hands of wafer (W) are switchable using those holder portions.

For example, wafer (W) is held by first holder portions (621e) in FIG. 10A. Then, after second holder portions (621f) are moved closer to wafer (W), first holder portions (621e) are moved away from wafer (W) so that the holding hands of wafer (W) are switched from first holder portions (621e) to second holder portions (621f) as shown in FIG. 10B.

Figure 11A:
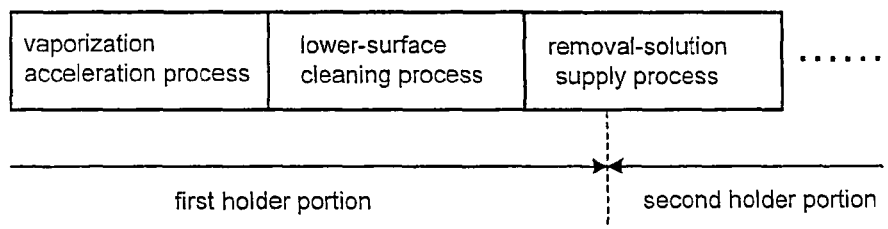
FIG. 11A is a view showing an example of timing for switching the holding hands of a wafer.

The timing of switching the holding hands of wafer (W) is described with reference to FIGS. 11A~11C. FIG. 11A shows timing of switching the holding hands of wafer (W). Also, FIGS. 11B and 11C show other examples of timing of switching the holding hands of wafer (W).

As shown in FIG. 11A, switching the holding hands of wafer (W) between first holder portions (621e) and second holder portions (621f) is performed according to predetermined timing during a removal-solution supply process (step (S110) in FIG. 5). More specifically, after the removal-solution supply process has started, and when the topcoat film is mostly washed away by the alkaline developing solution so that the topcoat film is unlikely to attach to second holder portions (621f), second holder portions (621f) are moved toward wafer (W), and then first holder portions (621e) are moved away from wafer (W).

In the third embodiment, the holding hands of wafer (W) are switched between first holder portions (621e) and second holder portions (621f). Thus, even if the topcoat film is attached to first holder portions (621e), contamination or damage to wafer (W) or the raising of dust is prevented by switching the holding hands to second holder portions (621f).

Figure 11B:
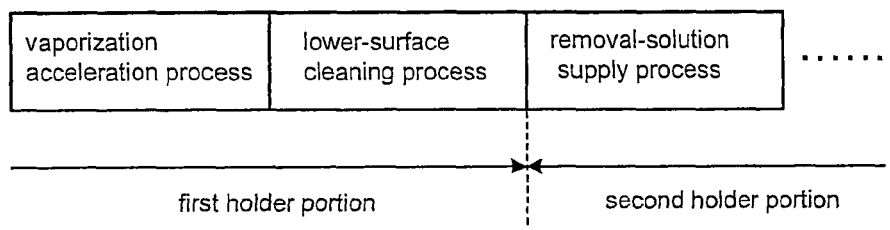
FIG. 11B is a view showing another example of timing for switching the holding hands of a wafer.
Figure 11C:
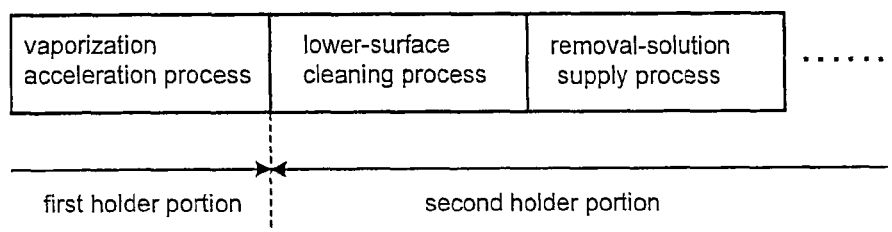
FIG. 11C is a view showing yet another example of timing for switching the holding hands of a wafer.

It is an option to switch the holding hands from first holder portions (621e) to second holder portions (621f) immediately after the lower-surface cleaning process as shown in FIG. 11B, or immediately after the vaporization acceleration process is finished as shown in FIG. 11C. When the topcoat solution solidifies, it is unlikely to attach to second holder portions (621*f*). Thus, if the holding hands of wafer (W) are switched immediately after the vaporization acceleration process, contamination or damage to wafer (W) or the raising of dust is prevented.

The second processing apparatus of the third embodiment may have a nozzle to supply an alkaline developing solution to first holder portions (621*e*) the same as in the second processing apparatus of the second embodiment, or may be set to constantly clean first holder portions (621*e*) using such a nozzle. Such a cleaning process is preferred to be conducted when wafer (W) is not present in second chamber 61.

Fourth Embodiment

Figure 12A:
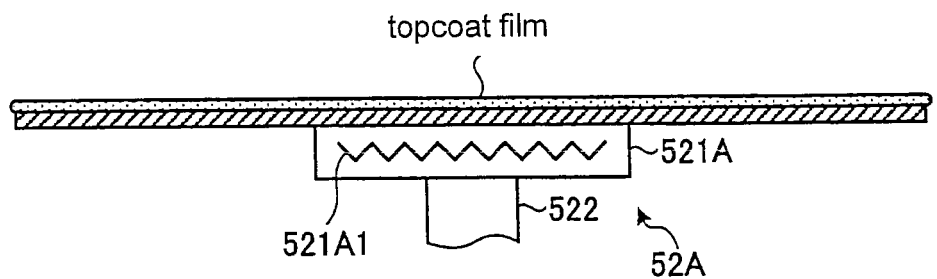
FIG. 12A is a view showing a modified example for providing a vaporization acceleration mechanism in the first processing apparatus.
Figure 12B:
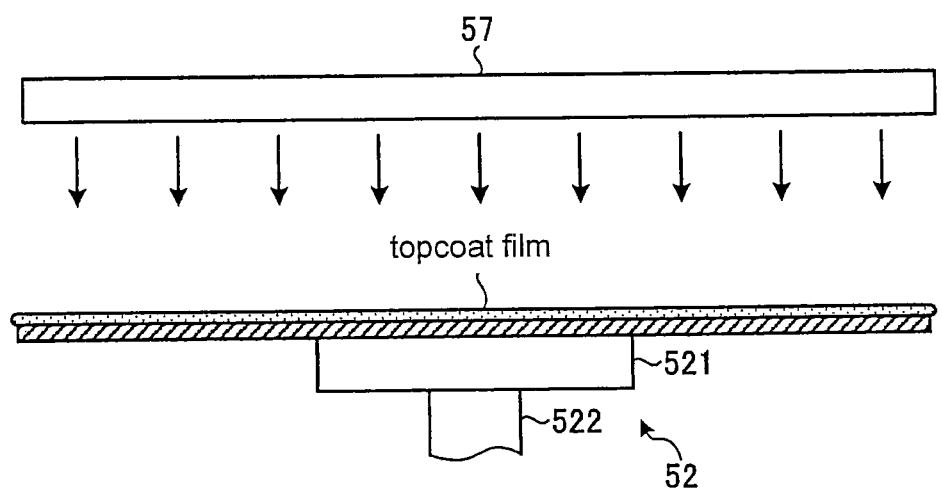
FIG. 12B is a view showing another modified example for providing a vaporization acceleration mechanism in the first processing apparatus.

In each embodiment above, a film-forming treatment solution supply process is set to be conducted in a first processing apparatus, and a vaporization acceleration process and a removal-solution supply process are set to be conducted in a second processing apparatus. However, a vaporization acceleration process may be conducted in a first processing apparatus. In the following, a modified example in which a vaporization acceleration mechanism is provided in a first processing apparatus is described by referring to FIGS. 12A and 12B. FIGS. 12A and 12B are views each showing a modified example in which a vaporization acceleration mechanism is provided in a first processing apparatus.

As shown in FIG. 12A, a first processing apparatus has first substrate holding device (52A), for example, instead of first substrate holding device 52. In suction-holding device (521A) equipped in first substrate holding device (52A), heating portion (521A1) is formed, and a vaporization acceleration process is conducted by heating portion (521A1). Namely, the topcoat solution is heated by heating portion (521A1). The heating temperature is 90° C., for example. Accordingly, vaporization of the volatile component contained in the topcoat solution is accelerated.

As described, by providing heating portion (521A1) in suction-holding device (521A), wafer (W), suction-held by the suction-holding device, is directly heated, effectively accelerating the vaporization of the volatile component contained in the topcoat solution. Heating portion (521A1) is an example of a vaporization acceleration device.

Alternatively, UV-ray irradiation section 57 may be further provided in a first processing apparatus as a vaporization acceleration device as shown in FIG. 12B. UV-ray irradiation section 57 is a UV (ultraviolet) lamp, for example, which is positioned above wafer (W), and irradiates ultraviolet rays toward the main surface of wafer (W) from above wafer (W). By doing so, the topcoat solution is activated and vaporization of its volatile component is accelerated.

UV-ray irradiation section 57 is preferred to be positioned higher than nozzles (531, 541) of solution supply devices (53, 54) to avoid interference with procedures performed by solution supply devices (53, 54). Alternatively, UV-ray irradiation section 57 may be made movable so as to position itself above wafer (W) only when it performs a vaporization acceleration process.

A first processing apparatus may also have a current-forming unit or a decompression device as a vaporization acceleration device, the same as second processing apparatus 6. Alternatively, a first processing apparatus may be equipped with a nozzle to supply high-temperature N2 gas from above wafer (W) to the main surface of wafer (W). Yet alternatively, a heating portion such as a heater may be positioned above wafer (W).

Fifth Embodiment

Figure 13:
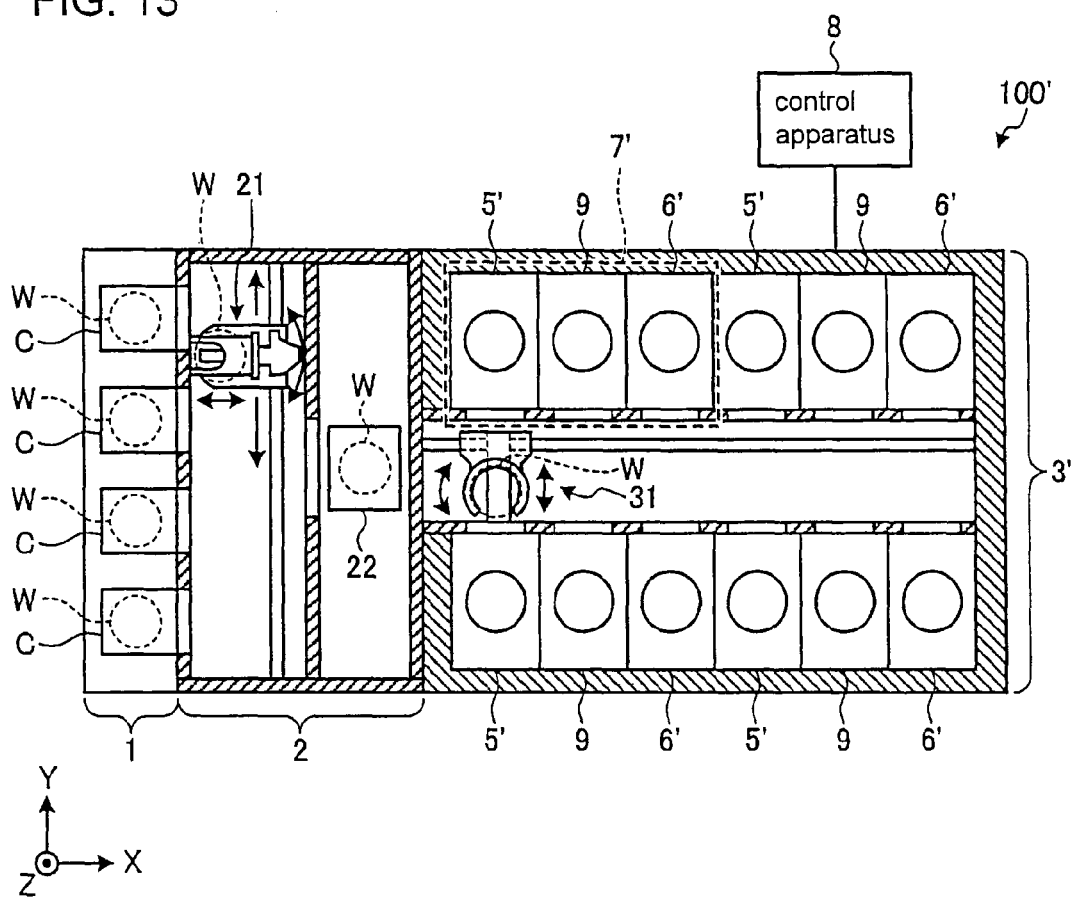
FIG. 13 is a view schematically showing the structure of a substrate cleaning system according to a fifth embodiment.

In each embodiment described above, a vaporization acceleration process is set to be conducted in either a first processing apparatus or a second processing apparatus. However, a substrate cleaning apparatus may further be equipped with a vaporization acceleration unit. Such an example is described by referring to FIG. 13. FIG. 13 is a view schematically showing the structure of a substrate cleaning system according to a fifth embodiment.

As shown in FIG. 13, substrate cleaning system (100') according to the fifth embodiment has processing station (3') instead of processing station 3 (see FIG. 1). Instead of substrate cleaning apparatus 7, substrate cleaning apparatus (7') is provided in processing station (3'). The rest of the structure is the same as that of substrate cleaning system 100.

Substrate cleaning apparatus (7') has three processing units: first processing apparatus (5'), second processing apparatus (6') and third processing apparatus 9. First processing apparatus (5'), second processing apparatus (6') and third processing apparatus 9 are set in position from the front toward the rear of substrate cleaning system (100') in the order of first processing apparatus (5'), third processing apparatus 9 and second processing apparatus (6'). However, first processing apparatus (5'), second processing apparatus (6') and third processing apparatus 9 are not limited to being positioned as shown in the drawing.

First processing apparatus (5') has the same structure as first processing apparatus 5 of the first embodiment. Also, second processing apparatus (6') has the same structure as second processing apparatus 6 of the first embodiment except that the structure for a vaporization acceleration process (N2 gas supply source 118, valve 128, current-forming unit 65, decompression device 66, and so forth) is excluded.

Figure 14:
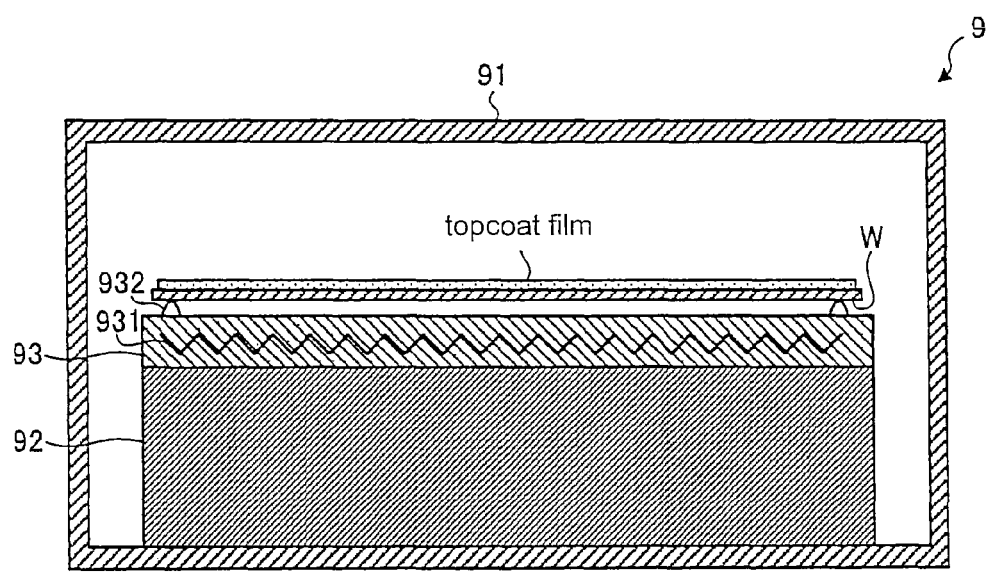
FIG. 14 is a view schematically showing an example of the structure of a third processing apparatus.

Third processing apparatus 9 is a processing unit for vaporization acceleration. An example of the structure of third processing apparatus 9 is described by referring to FIG. 14. FIG. 14 is a view schematically showing an example of the structure of third processing apparatus 9.

As shown in FIG. 14, third processing apparatus 9 has base table 92 and hotplate 93 in third chamber 91. Base table 92 is positioned at the bottom of third chamber 91 and supports hotplate 93 at a predetermined height.

Heating portion 931 is provided inside hotplate 93. Support pin 932 to support wafer (W) is provided above heating portion 931.

In substrate cleaning apparatus (7') of the fifth embodiment, after the first unloading process shown in step (S106) of FIG. 5, wafer (W) is loaded into third processing apparatus 9 by substrate transfer apparatus 31 and placed on support pin 932 of hotplate 93. Then, wafer (W) is heated by hotplate 93 in third processing apparatus 9. In so doing, the topcoat solution is also heated along with wafer (W) and vaporization of the volatile component is accelerated.

The substrate cleaning apparatus may be structured to be equipped with a first processing apparatus to conduct a film-forming treatment solution supply process, a second processing apparatus to conduct a removal-solution supply process, and a third processing apparatus to conduct a vaporization acceleration process.

The structure of third processing apparatus 9 is not limited to that shown in FIG. 14. For example, it is an option for third processing apparatus 9 to have a substrate holding device the same as second substrate holding device 62 of second processing apparatus 6, and to heat wafer (W) by supplying high-temperature N2 gas to the lower surface of wafer (W) from the gas supply device. Alternatively, third processing apparatus 9 may have a current-forming unit, a decompression device, a UV-ray irradiation device or the like as a vaporization acceleration device.

In each embodiment above, chemical solution treatment and a film-forming treatment solution supply process are set to be conducted in a first processing apparatus. However, chemical solution treatment may be conducted in another unit independent of the first processing apparatus. Alternatively, chemical solution treatment may be conducted in a second processing apparatus. In such an example, solution supply device 53 or the like may be provided in the second processing apparatus.

Sixth Embodiment

In the first embodiment, a lower-surface cleaning process is set to be conducted by supplying a cleaning solution such as SC1 to the lower surface of wafer (W). However, the lower-surface cleaning process is not limited to such a process. For example, as a lower-surface cleaning process, it is an option to conduct scrubbing using cleaning utensils such as a brush, two-fluid cleaning using a two-fluid nozzle to spray a cleaning solution mist formed by a gas onto the lower surface of wafer (W), or ultrasonic cleaning using an ultrasonic oscillator or the like.

Figure 15A:
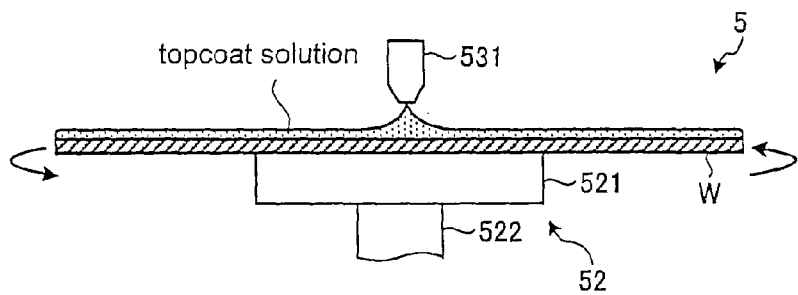
FIG. 15A is a view showing a modified example of a lower-surface cleaning process.
Figure 15B:
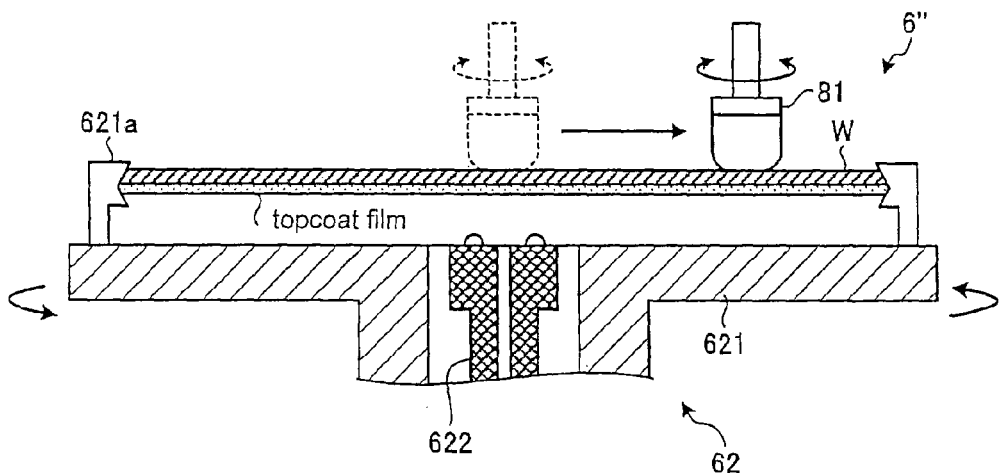
FIG. 15B is a view showing another modified example of a lower-surface cleaning process.
Figure 15C:
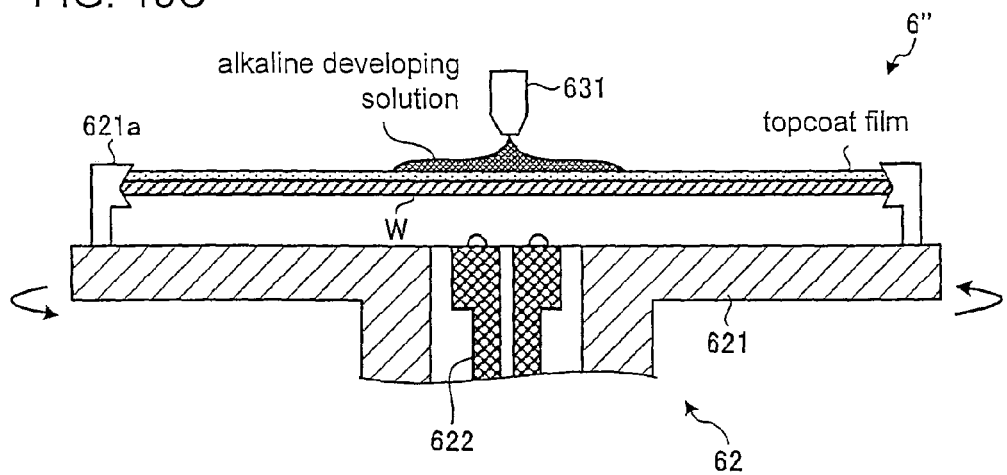
FIG. 15C is a view showing yet another modified example of a lower-surface cleaning process.

An example of scrubbing cleaning as a lower-surface cleaning process is described with reference to FIGS. 15A~15C. FIGS. 15A~15C are views illustrating a modified example of a lower-surface cleaning process.

When scrubbing cleaning is conducted as a lower-surface cleaning process, first, procedures the same as those in steps (S101)~(S106) shown in FIG. 5 are conducted in first processing apparatus 5. FIG. 15A is a view showing an example of a film-forming treatment solution supply process in step (S105) of FIG. 5.

Next, a process is conducted to invert wafer (W) unloaded from first processing apparatus 5. Such an inversion process is conducted using a substrate inversion device (not shown) provided in processing station 3. Any well-known technology is applied for such a substrate inversion device.

Wafer (W) inverted by a substrate inversion device is loaded into second processing apparatus (6") by substrate transfer device 31 (second loading process). Accordingly, wafer (W) is held by second substrate holding device 62 of second processing apparatus (6") with its lower surface facing upward. Next, a vaporization acceleration process is conducted in second processing apparatus (6") (step (S108) of FIG. 5).

Next, as shown in FIG. 15B, scrubbing cleaning is conducted on the lower surface of wafer (W) using brush 81 provided in second processing apparatus (6"). Namely, foreign substances attached to the lower surface of wafer (W) are removed as rotating brush 81 is moved while the brush is in contact with the lower surface of wafer (W). At that time, a cleaning solution may be supplied from nozzle 631. Also, during scrubbing cleaning, it is an option to supply a flowing substance such as N2 gas from flowing-substance supply portion 622 to prevent particles from attaching to the topcoat film.

Next, wafer (W) is unloaded from second processing apparatus (6") by substrate transfer device 31, inverted again by the substrate inversion device (not shown), and loaded in second processing apparatus (6") by substrate transfer device 31. Then, the same processes as those shown in steps (S110)~(S113) of FIG. 5 are conducted in second processing apparatus (6"). FIG. 15C shows an example of how to conduct a removal-solution supply process in step (S110) of FIG. 5.

In the above, a vaporization acceleration process is set to be conducted in second processing apparatus (6") after wafer (W) is loaded in second processing apparatus (6"). However, a vaporization acceleration process may be conducted in first processing apparatus 5 and wafer (W) may be inverted after being unloaded from first processing apparatus 5. Also, in the above example, a removal-solution supply process is set to be conducted with the main surface of wafer (W) facing upward. However, a removal-solution supply process may be conducted with the lower surface of wafer (W) facing upward; namely, it is an option to conduct the removal-solution supply process by following the lower-surface cleaning process without unloading wafer (W) and without inverting wafer (W) again. In addition, although brush 81 is used above, other cleaning utensils such as a sponge may be used for scrubbing cleaning.

A lower-surface cleaning process is not the only process to be conducted after the main surface of wafer (W) is coated with a topcoat film. For example, it may be etching or the like to etch the lower surface or bevel portion of wafer (W) using a chemical solution. An etching process means to remove oxide film using hydrofluoric acid (HF) or the like, for example. By conducting an etching process after the main surface of wafer (W) is coated with a topcoat film, even if a chemical solution is spilled over from the lower-surface side to the main-surface side of wafer (W), the main surface of wafer (W) will not be etched since it is protected by a topcoat film. As a result, etching is conducted accurately since the etching region is determined by the topcoat film.

A process conducted after the main surface of wafer (W) is coated with a topcoat film may also be a polishing process to polish the lower surface or bevel portion of wafer (W) using a polishing brush.

By treating the other surface of wafer (W) after the main surface of wafer (W) is coated with topcoat film, contamination on the main surface of wafer (W) is prevented while the other surface of wafer (W) is treated.

Seventh Embodiment

Figure 16:
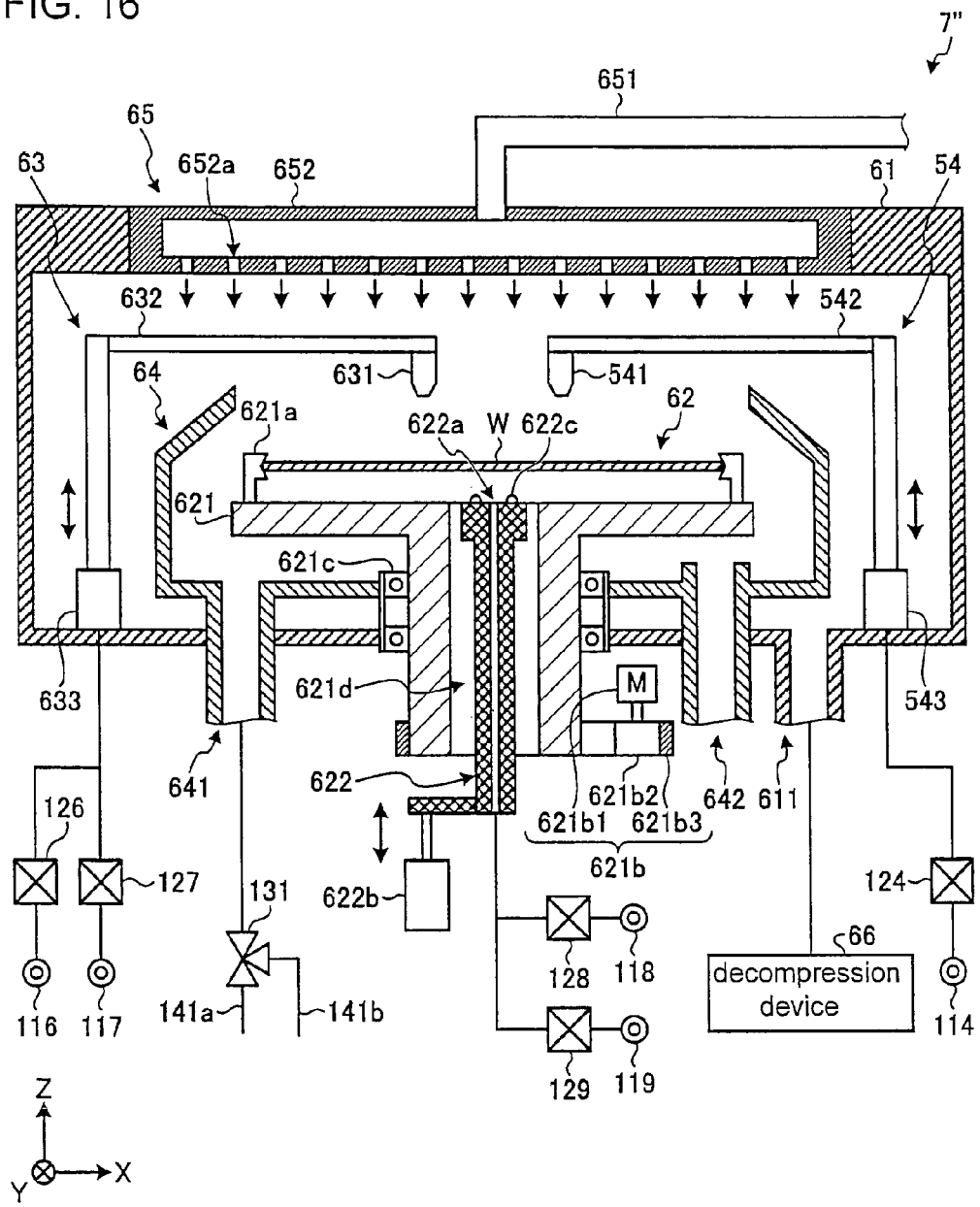
FIG. 16 is a view schematically showing the structure of a substrate cleaning apparatus according to a seventh embodiment.

In each embodiment above, a substrate cleaning apparatus has multiple processing units and a film-forming treatment solution supply process and a removal-solution supply process are set to be conducted in different processing units. However, it is an option for a substrate cleaning apparatus to perform a film-forming treatment solution supply process and a removal-solution supply process in a single chamber. An example of the structure of such a substrate cleaning apparatus is described with reference to FIG. 16. FIG. 16 is a view schematically showing the structure of a substrate cleaning apparatus according to a seventh embodiment.

As shown in FIG. 16, substrate cleaning apparatus (7") of the seventh embodiment is structured to further include a solution supply device 54 of first processing apparatus 5 in second chamber 61 of second processing apparatus 6 of the first embodiment, for example. The same as in the first embodiment, solution supply device 54 is connected to film-forming treatment solution supply source 114 through valve 124, and a topcoat solution provided from such film-forming treatment solution supply source 114 is supplied to the main surface of wafer (W).

In substrate cleaning apparatus (7"), a film-forming treatment solution supply process (step (S105) of FIG. 5) is conducted by solution supply device 54 when the periphery of wafer (W) is held by holder portion (621a) of second substrate holding device 62. Then, steps after a vaporization acceleration process (steps (S108)~S(113) in FIG. 5) are conducted in substrate cleaning apparatus (7").

As described, by conducting a film-forming treatment solution supply process and a removal-solution supply process in a single processing unit, the time to be spent for transferring wafer (W) is reduced. Also, space saving in processing station 3 is achieved.

In the above, a film-forming treatment solution supply process and a removal-solution supply process are conducted while wafer (W) is held by second substrate holding device 62. However, that is not the only option. For example, a holder portion to hold the periphery of wafer (W) is provided in a suction-holding device to suction-hold the lower surface of wafer (W) so that the holding hands of wafer (W) may be switched between the suction-holding device and the holder portion.

In such a film-forming treatment solution supply process, it is preferred to use a suction-holding device, which does not have a section in contact with the upper surface of wafer (W) so that a topcoat solution can be spread on the entire upper surface of wafer (W). Also, when the removal-solution supply process is conducted, it is preferred to use a holder portion that can easily clean the lower surface of wafer (W). The holding hands of wafer (W) from the suction-holding device to the holder portion may be switched after the vaporization acceleration process is completed.

As shown in FIG. 16, drain line (141a) and collection line (141b) may be connected to drain port 641 so that those lines (141a, 141b) are switchable by diverter valve 131. By so setting, the topcoat solution removed from wafer (W) is drained to drain line (141a) while a recyclable alkaline removal solution is drained to collection line (141b).

Other Embodiments

In each of the above embodiments, a topcoat solution has been used as a film-forming treatment solution. However, the film-forming treatment solution is not limited to a topcoat solution.

The film-forming treatment solution may also be a treatment solution containing phenolic resin. Since phenolic resin also causes curing contraction the same as acrylic resin described above, it is effective to provide tensile force to particles the same as topcoat solutions.

An example of a film-forming treatment solution containing phenolic resin is a resist solution. Resist solutions are film-forming treatment solutions to form resist film on wafer (W). In particular, novolac-based phenolic resin is contained in a resist solution.

When a resist solution is used for a film-forming treatment solution, a thinner that dissolves the resist solution may be used as a removal solution. When a thinner is used as a removal solution, a rinsing process after the removal-solution supply process may be omitted. Also, when a resist solution is used as a film-forming treatment solution, it is an option to supply a removal solution after an exposure-to-light process such as whole image exposure is performed on the resist film formed on wafer (W). In such an example, either a developing solution or a thinner may be selected as a removal solution.

A synthetic resin contained in a film-forming treatment solution is not limited to acrylic resin or phenolic resin described above, and it may be any type as long as it causes curing contraction. Examples of synthetic resins contained in a film forming treatment solution are as follows: epoxy resin, melanin resin, urea resin, unsaturated polyester resin, alkyd resin, polyurethane, polyimide, polyethylene, polypropylene, polyvinylidene chloride, polystyrene, polyvinyl acetate, polytetrafluoroethylene, acrylonitrile butadiene styrene resin, styrene acrylonitrile resin, polyamide, nylon, polyacetal, polycarbonate, denatured polyphenylene ether, polybutylene terephthalate, polyethylene terephthalate, polyphenylene sulfide, polysulfone, polyether ether ketone and polyamideimide.

As for a film-forming treatment solution, an antireflective film solution may also be used. An antireflective film solution is for forming antireflective film on wafer (W). Antireflective film is protective film to reduce reflection on the main surface of wafer (W) and to increase permeability. When such an antireflective film solution is used as a film-forming treatment solution, DIW that dissolves the antireflective film solution may be used as a removal solution.

In addition to a volatile component and synthetic resin, a film-forming treatment solution may further contain a predetermined chemical solution to dissolve wafer (W) or the material formed on wafer (W) or foreign substances attached to wafer (W). Here, "material formed on wafer (W)" means base film on wafer (W), for example. "Foreign substances attached to wafer (W)" are, for example, particles of metallic contaminants. Also, a "predetermined chemical solution" is, for example, hydrogen fluoride, ammonium fluoride, hydrochloric acid, sulfuric acid, hydrogen peroxide solution, phosphoric acid, acetic acid, nitric acid, ammonium hydroxide and the like. When surfaces of base film and particles are dissolved by such chemical solutions, the adhesive force of the particles is lowered. Thus, the particles are more likely to be removed.

In each of the embodiments above, an alkaline developing solution has been used as a removal solution. However, a hydrogen peroxide solution may be added to the alkaline developing solution. When a hydrogen peroxide solution is added to an alkaline developing solution, wafer surfaces may be suppressed from being roughened by the alkaline developing solution.

A removal solution may be organic solvents such as thinner, toluene, acetates, alcohols, glycols (propylene glycol monomethyl ether) or the like, or it may be an acidic developing solution such as acetic acid, formic acid, hydroxyacetic acid or the like.

A removal solution may further contain a surfactant. Since a surfactant works to reduce surface tension, it can suppress particles from reattaching to wafer (W) or the like.

When cleaning or the like was conducted on the lower surface of a substrate, there were concerns of contamination of the main surface of the substrate by the solution spun off from the lower surface or spilled over from the lower surface to the main surface Using the substrate cleaning method and substrate cleaning system according to an embodiment of the present invention, contamination on the main surface of a substrate is prevented while the other surface of the substrate is treated.

A method for cleaning a substrate according to an embodiment of the present invention includes a first supply process, a process for treating the other surface and a second supply process. In the first supply process, a treatment solution containing a volatile component and capable of forming a film on the entire main surface of a substrate is supplied to the substrate. In the other-surface treatment process, the other surface of the substrate is treated after the entire main surface of the substrate is coated with a film formed when the treatment solution has solidified or cured through vaporization of the volatile component. In the second supply process, a removal solution which dissolves the entire film is supplied to the substrate after the other surface has been treated.

According to an embodiment of the present invention, the other surface of a substrate is treated while contamination on the main surface of the substrate is prevented. Also, particles attached to the substrate are removed, and pattern collapse or base film erosion is suppressed.

Obviously, numerous modifications and variations of the present invention are possible in light of the above teachings. It is therefore to be understood that within the scope of the appended claims, the invention may be practiced otherwise than as specifically described herein.

What is claimed is:

1. A method for cleaning a substrate, comprising:
   supplying a treatment solution which includes a volatile component onto a front surface of a substrate in an amount sufficient such that the treatment solution covers an entire portion of the front surface of the substrate and spills over onto a back surface from a periphery of the substrate;
   solidifying or curing the treatment solution through vaporization of the volatile component of the treatment solution such that a treatment film is formed on the entire portion of the front surface of the substrate and a peripheral portion of the back surface of the substrate;
   supplying to the peripheral portion of the back surface of the substrate a first removal solution which removes the treatment film in an amount sufficient such that the first removal solution removes part of the treatment film formed on the peripheral portion of the back surface of the substrate and on a peripheral portion of the front surface of the substrate;
   treating the back surface of the substrate while the entire portion of the front surface of the substrate is covered with the treatment film; and
   supplying to the substrate a second removal solution which removes the treatment film in an amount sufficient such that the second removal solution removes the treatment film substantially from the entire portion of the front surface of the substrate after the treating of the back surface of the substrate is finished.

2. The method for cleaning a substrate according to claim 1, wherein the front surface of the substrate is a circuit forming surface, and the treatment on the back surface comprises cleaning the back surface of the substrate.

3. The method for cleaning a substrate according to claim 2, wherein the cleaning of the back surface of the substrate is conducted with the back surface of the substrate facing upward.

4. The method for cleaning a substrate according to claim 3, wherein the supplying of the second removal solution is conducted with the back surface of the substrate facing downward.

5. The method for cleaning a substrate according to claim 3, wherein the supplying of the second removal solution is conducted with the back surface of the substrate facing upward.

6. The method for cleaning a substrate according to claim 2, wherein the cleaning of the back surface of the substrate is conducted with the back surface of the substrate facing downward.

7. The method for cleaning a substrate according to claim 1, wherein the treating of the back surface is conducted while holding a peripheral portion of the substrate.

8. The method for cleaning a substrate according to claim 1, wherein the supplying of the treatment solution is conducted while the back surface of the substrate is suction-held, and the supplying of the second removal solution is conducted while the peripheral portion of the substrate is held.

9. The method for cleaning a substrate according to claim 1, wherein the solidifying or curing of the treatment solution includes accelerating the vaporization of the volatile component in the treatment solution, and the accelerating the vaporization of the treatment solution is conducted after the supplying of the treatment solution is finished and prior to the treatment of the back surface starts.

10. The method for cleaning a substrate according to claim 9, wherein the accelerating the vaporization of the treatment solution comprises heating the treatment solution such that the vaporization of the volatile component is accelerated.

11. The method for cleaning a substrate according to claim 1, wherein the treating of the back surface of the substrate and the supplying of the second removal solution are conducted in a single chamber.

12. The method for cleaning a substrate according to claim 1, further comprising supplying to the front surface of the substrate a chemical solution which weakens adhesive force of particles such that the chemical solution weakens the adhesive force of the particles attached to the front surface of the substrate prior to the supplying of the treatment solution.

13. The method for cleaning a substrate according to claim 1, further comprising:
   transferring the substrate from a first processing apparatus to a second processing apparatus,
   wherein the front surface of the substrate is a circuit forming surface, the supplying of the treatment solution, the solidifying or curing of the treatment solution and the supplying of the first removal solution are conducted in the first processing apparatus while the back surface of the substrate is suction-held, and the treating of the back surface of the substrate and the supplying of the second removal solution are conducted in the second processing apparatus while the peripheral portion of the substrate is held such that the back surface of the substrate is facing downward, that the treating of the back surface of the substrate comprises dispensing a chemical solution upward toward the back surface of the substrate, and that the supplying of the second removal solution comprises dispensing the second removal solution downward toward the front surface of the substrate.

* * * * *